(12) United States Patent
Choi et al.

(10) Patent No.: US 9,412,774 B2
(45) Date of Patent: Aug. 9, 2016

(54) IMAGE SENSOR HAVING A METAL PATTERN BETWEEN COLOR FILTERS

(71) Applicant: SAMSUNG ELECTRONICS CO., LTD., Suwon-si, Gyeonggi-do (KR)

(72) Inventors: Ha-Kyu Choi, Yongin-si (KR); Chang-Rok Moon, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/660,006

(22) Filed: Mar. 17, 2015

(65) Prior Publication Data
US 2016/0035775 A1 Feb. 4, 2016

(30) Foreign Application Priority Data
Jul. 30, 2014 (KR) .................. 10-2014-0097589

(51) Int. Cl.
H01L 27/146 (2006.01)

(52) U.S. Cl.
CPC ...... *H01L 27/14621* (2013.01); *H01L 27/1463* (2013.01); *H01L 27/1464* (2013.01); *H01L 27/14627* (2013.01); *H01L 27/14636* (2013.01); *H01L 27/14685* (2013.01)

(58) Field of Classification Search
CPC .............. H01L 31/00; H01L 27/14621; H01L 27/14627
USPC .......................................................... 257/440
See application file for complete search history.

(56) References Cited

U.S. PATENT DOCUMENTS

| | | | |
|---|---|---|---|
| 7,709,871 B2 | 5/2010 | Hwang | |
| 7,750,354 B2 | 7/2010 | Kasano et al. | |
| 2009/0168181 A1* | 7/2009 | Su et al. | 359/586 |
| 2012/0075509 A1* | 3/2012 | Ito et al. | 348/265 |
| 2013/0100324 A1 | 4/2013 | Ogino et al. | |
| 2013/0270667 A1 | 10/2013 | Wang et al. | |
| 2013/0307104 A1 | 11/2013 | Tsai et al. | |
| 2015/0187843 A1* | 7/2015 | Hatano et al. | H01L 27/307 |

* cited by examiner

*Primary Examiner* — Marc Armand
(74) *Attorney, Agent, or Firm* — Lee & Morse, P.C.

(57) ABSTRACT

An image sensor includes an inorganic color filter, an organic color filter, and a metal pattern. The inorganic color filter is on a support substrate. The organic color filter is on the support substrate. The organic color filter is spaced apart from the inorganic color filter. The metal pattern is between the inorganic color filter and the organic color filter.

17 Claims, 38 Drawing Sheets

IMAGE SENSOR HAVING A METAL PATTERN BETWEEN COLOR FILTERS

CROSS-REFERENCE TO RELATED APPLICATION

Korean Patent Application No. 10-2014-0097589, filed on Jul. 30, 2014, in the Korean Intellectual Property Office, and entitled: "Image Sensor Having Metal Pattern Disposed Between Color Filters," is incorporated by reference herein in its entirety.

BACKGROUND

1. Field

Embodiments relate to an image sensor having metal pattern disposed between color filters.

2. Description of Related Art

An image sensor may include a plurality of color filters. The image sensor may further include a metal pattern to prevent optical cross-talk between pixels. The metal pattern may be disposed between the color filters. Various investigations into how to form the metal pattern between the color filters in the image sensor without damage to the color filters, e.g., the degradation of the color filters, etc., have been conducted.

SUMMARY

One or more embodiments is directed to an image sensor that includes an inorganic color filter, an organic color filter, and a metal pattern. The inorganic color filter is on a support substrate. The organic color filter is on the support substrate. The organic color filter is spaced apart from the inorganic color filter. The metal pattern is disposed between the inorganic color filter and the organic color filter.

The organic color filter may extend onto the metal pattern.

A horizontal width of an upper surface of the organic color filter may be larger than a horizontal width of an upper surface of the inorganic color filter.

A horizontal width of a lower surface of the organic color filter may be same as a horizontal width of a lower surface of the inorganic color filter.

A level of an upper end of the metal pattern may be lower than a level of an upper surface of the inorganic color filter.

The inorganic color filter may include a lower inorganic color filter and an upper inorganic color filter on the lower inorganic color filter. The upper inorganic color filter may extend onto the metal pattern.

One or more embodiments is directed to an image sensor that includes an inorganic color filter, a metal pattern, a first organic color filter, and a second organic color filter. The metal pattern surrounds side surfaces of the inorganic color filter. The first organic color filter is spaced apart from the inorganic color filter in a first direction. The second organic color filter is spaced apart from the inorganic color filter in a second direction. The second direction is perpendicular to the first direction.

A length the first organic color filter in the second direction may be greater than a length of the inorganic color filter in the second direction. A length of the second organic color filter in the first direction may be greater than a length of the inorganic color filter in the first direction.

One or more embodiments is directed to an image sensor that includes first inorganic color filters, first organic color filters, second inorganic color filters, second organic color filters, and a metal pattern. The first inorganic color filters are arranged in a first direction. The first organic color filters are between the first inorganic color filters. The second inorganic color filters are in a first direction. The second inorganic color filters are spaced apart from the first inorganic color filters in a second direction. The second direction is perpendicular to the first direction. The second organic color filters are disposed between the second inorganic color filters. The metal pattern is disposed among the first inorganic color filters, the first organic color filters, the second inorganic color filters, and the second organic color filters. The first inorganic color filters and the second inorganic color filters are arranged in a crisscross. The first organic color filters and the second organic color filters are arranged in a crisscross.

The metal pattern may be a mesh shape.

One or more embodiments is directed to an image sensor that includes a metal pattern having first and second sidewalls spaced apart along the first direction, an inorganic color filter on the first sidewall of the metal pattern, the first sidewall of the first metal pattern being conformal to at least a portion of the sidewall of the inorganic color filter, an organic color filter on the second sidewall of the metal pattern and having a sidewall conformal to at least a portion of the second sidewall of the first metal pattern.

A cross section of the metal pattern adjacent to the inorganic color filter along a diagonal to the first direction may have a different shape than a cross section of the metal pattern adjacent to the organic color filter along a diagonal to the first direction.

The organic color filter may cover the cross section of the metal pattern adjacent to the organic color filter along the diagonal to the first direction.

A thickness of the cross section of the metal pattern adjacent to the inorganic color filter along the diagonal to the first direction is different from a thickness of the cross section of the metal pattern adjacent to the organic color filter along the diagonal to the first direction.

An upper surface of the first and second metal patterns may be at a same level as an upper surface of at least one of the inorganic color filter and the organic color filter.

BRIEF DESCRIPTION OF THE DRAWINGS

Features will become apparent to those of skill in the art by describing in detail exemplary embodiments with reference to the attached drawings in which:

FIGS. 9A to 17A, 9B to 17B, and 9C to 17C illustrate cross-sectional views of stages in a method of manufacturing an image sensor in accordance with embodiments;

FIGS. 18A to 23A, 18B to 23B, and 18C to 23C illustrate cross-sectional views of stages in a method of manufacturing an image sensor in accordance with embodiments;

DETAILED DESCRIPTION

Figure 1:
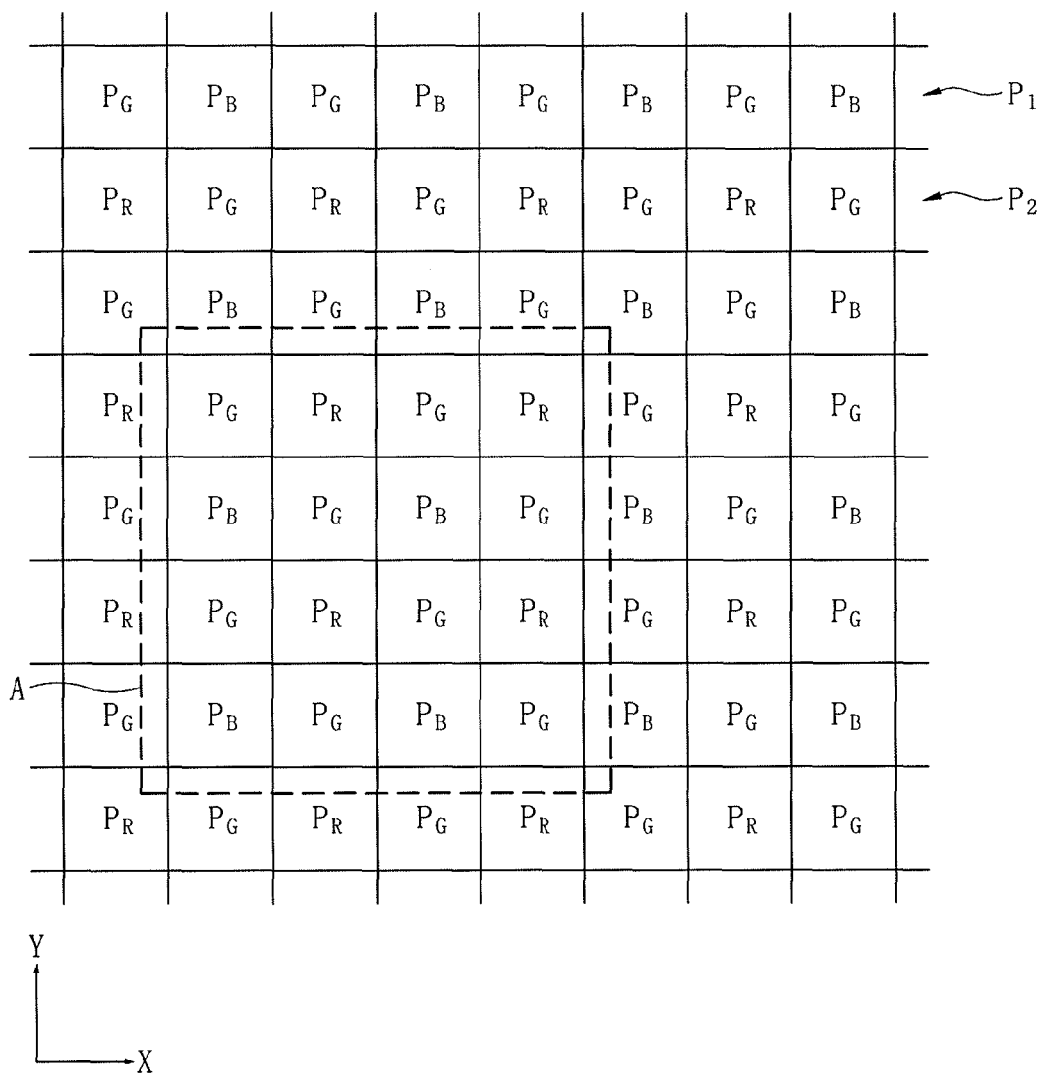
FIG. 1 illustrates a view showing a pixel arrangement of an image sensor in accordance with embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings herein.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary Embodiments

FIG. 1 illustrates a view showing a pixel arrangement of an image sensor in accordance with embodiments.

Referring to FIG. 1, the image sensor includes a first row P1 alternating green pixels PG and blue pixels PB, and a second row P2 alternating red pixels PR and green pixels PG. The first row P1 and the second row P2 are repeated. The green pixels PG of the first row P1 and the green pixels PG of the second row P2 are arranged to face each other along a diagonal direction. For example, the green pixels PG may be arranged in a zigzag shape. The blue pixels PB of the first rows P1 may be arranged to face the red pixels PR of the second rows P2 along a diagonal direction.

Each of the green pixels PG may have substantially the same area as each of the blue pixels PB. Each of the green pixels PG may have substantially the same horizontal width as each of the blue pixels PB, e.g., along a first direction. Each of the blue pixels PB may have substantially the same area as each of the red pixels PR. Each of the blue pixels PB may have substantially the same horizontal width as each of the red pixels PR.

As shown in FIG. 1, relative to some green pixels PG, e.g., the green pixel PG in the upper left hand corner of a portion 'A,' red pixels PR may be spaced therefrom along the first direction and blue pixels PB may be spaced therefrom along a second direction, perpendicular to the first direction. However, relative to other green pixels PG, e.g., the lower right hand corner of the portion 'A,' blue pixels PB may be spaced therefrom along the first direction and red pixels may be spaced therefrom along the second direction. Relative to each green pixel PG, the red pixels PR and the blue pixels PB are spaced therefrom along orthogonal directions.

Figure 2:
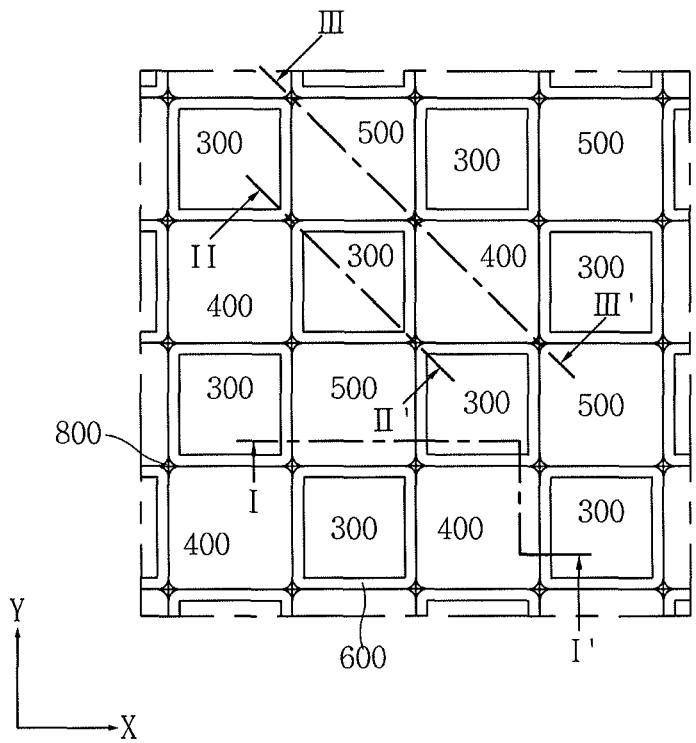
FIG. 2 illustrates a layout of a portion 'A' shown in FIG. 1.
Figure 3A:
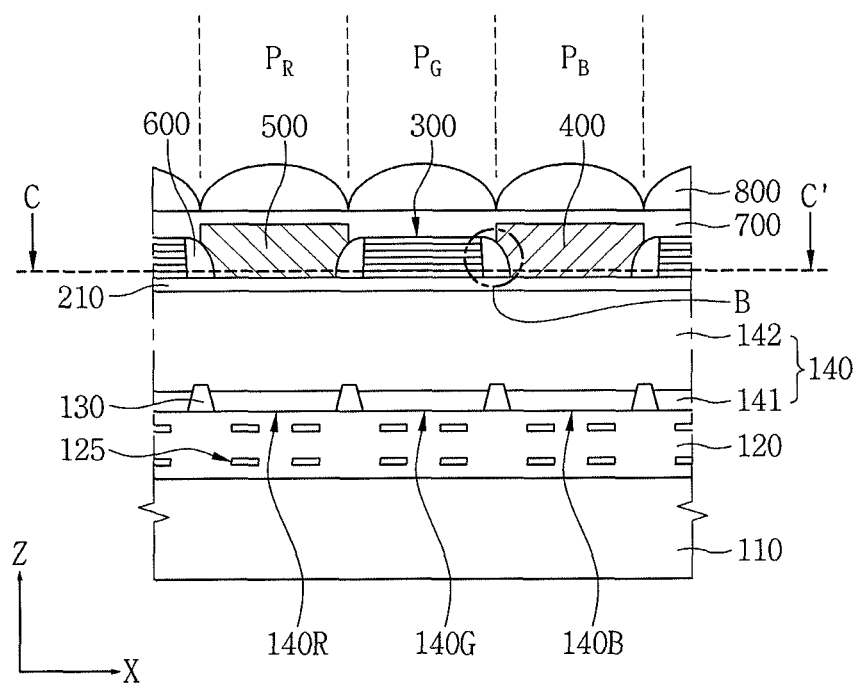
FIG. 3A illustrates a cross-sectional view taken along a line I-I' shown in FIG. 2.
Figure 3B:
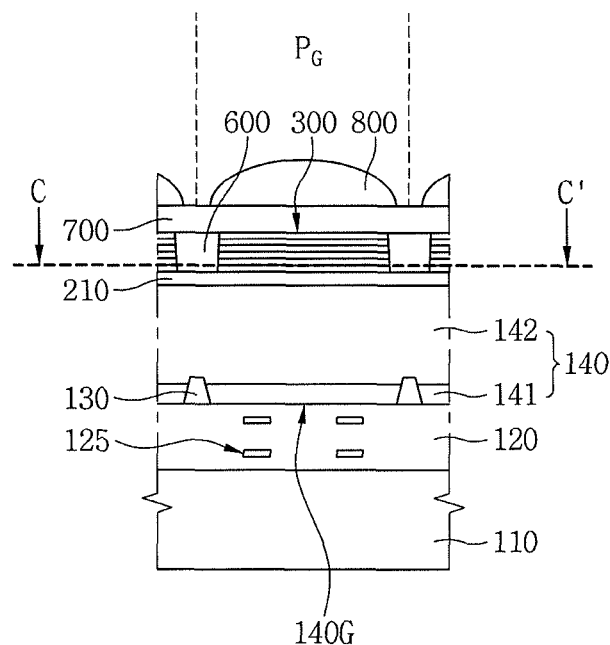
FIG. 3B illustrates a cross-sectional view taken along a line II-II' shown in FIG. 2.
Figure 3C:
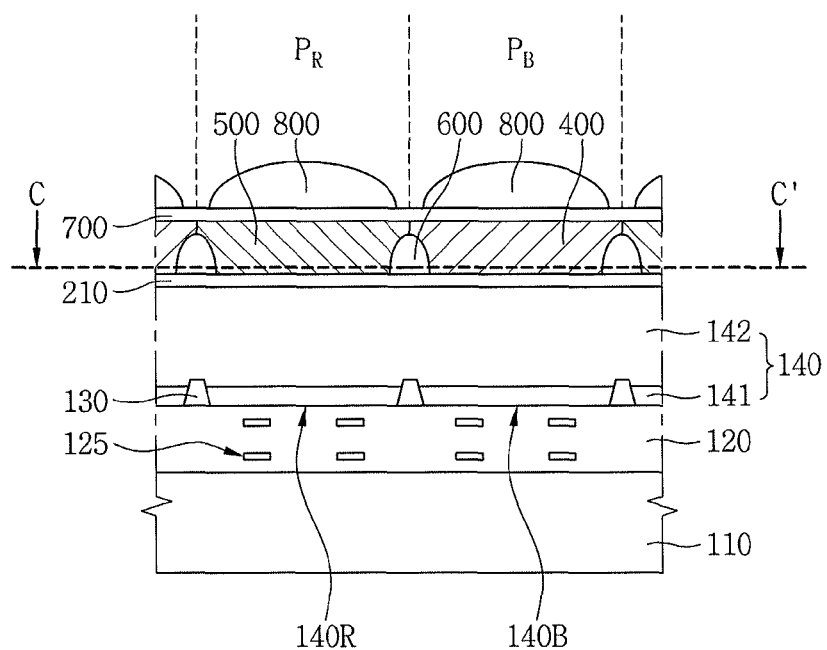
FIG. 3C illustrates a cross-sectional view taken along a line III-III' shown in FIG. 2.
Figure 3D:
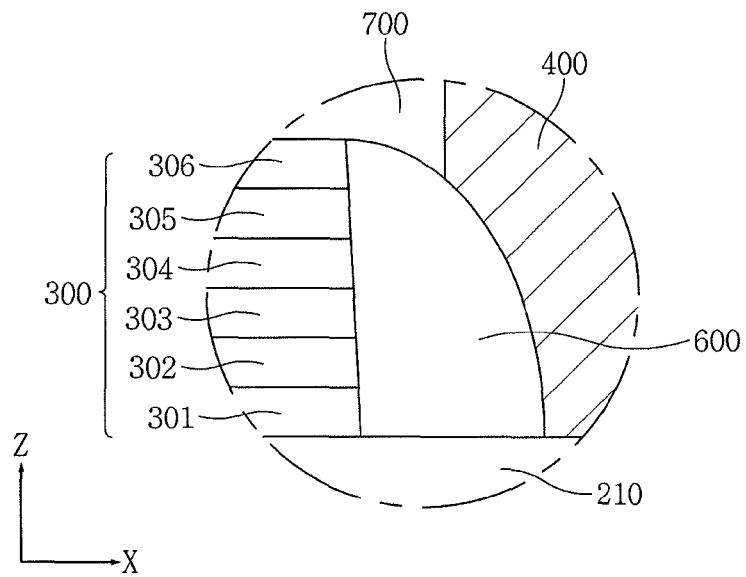
FIG. 3D illustrates an enlarged cross-sectional view of a portion 'B' of FIG. 3A.
Figure 3E:
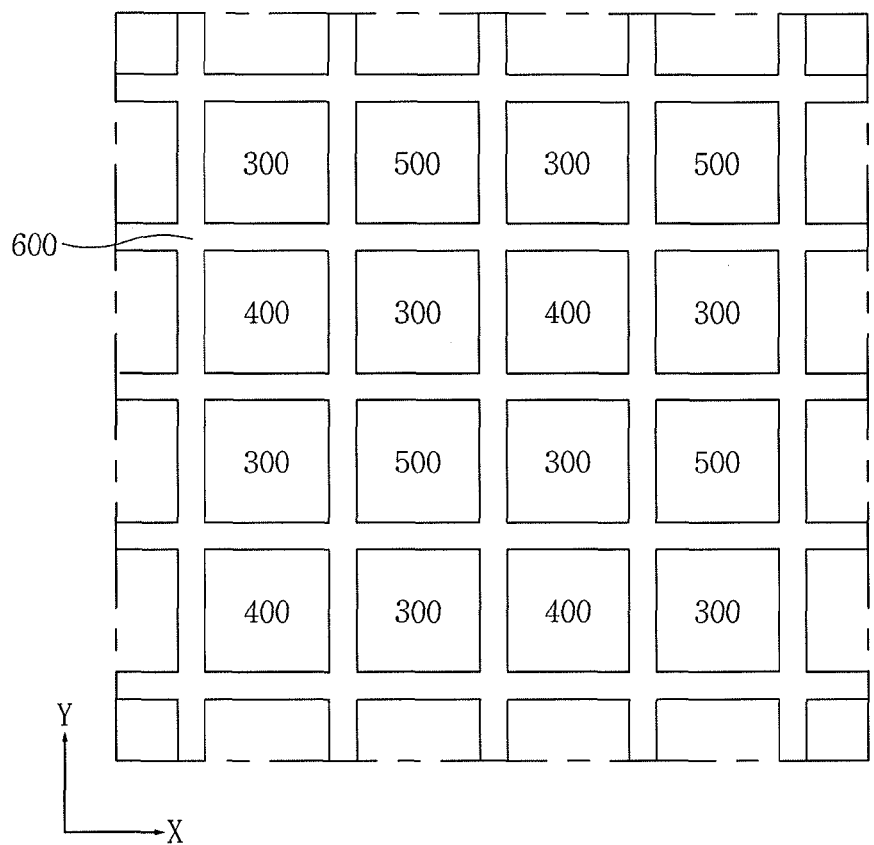
FIG. 3E illustrates a plan view taken along a line C-C' shown in FIGS. 3A to 3C.

FIG. 2 illustrates a layout of the portion 'A' shown in FIG. 1. FIG. 3A illustrates a cross-sectional view taken along a line I-I' shown in FIG. 2. FIG. 3B illustrates a cross-sectional view taken along a line II-II' shown in FIG. 2. FIG. 3C illustrates a cross-sectional view taken along a line shown in FIG. 2. FIG. 3D illustrates an enlarged cross-sectional view of a portion 'B' of FIG. 3A. FIG. 3E illustrates a plan view taken along a line C-C' shown in FIGS. 3A to 3C.

Referring to FIGS. 2 and 3A to 3E, the image sensor includes a support substrate 110, an insulating interlayer 120, isolation structures 130, green photoelectric elements 140G, blue photoelectric elements 140B, red photoelectric elements 140R, a buffer layer 210, green color filters 300, blue color filters 400, red color filters 500, a metal pattern 600, a planarization layer 700, and microlenses 800.

The support substrate 110 may include a semiconductor substrate, a glass substrate and a metal substrate. The support substrate 110 may include the green pixels PG, the blue pixels PB and the red pixels PR.

The insulating interlayer 120 may be on the support substrate 110. The support substrate 110 may be attached to the insulating interlayer 120. The insulating interlayer 120 may include internal circuit lines 125. The insulating interlayer 120 may include an insulating material. For example, the insulating interlayer 120 may include silicon oxide and silicon nitride. The insulating interlayer 120 may have a multilayered structure.

The isolation structures 130 may be on the insulating interlayer 120. The isolation structures 130 may be between the green pixels PG, the blue pixels PB, and the red pixels PR of the support substrate 110. The isolation structures 130 may include an insulating material. For example, the isolation structures 130 may include silicon oxide.

The green photoelectric elements 140G, the blue photoelectric elements 140B, and the red photoelectric elements 140R may absorb incident light to generate/store electric charge corresponding to the absorbed light. The green photoelectric elements 140G may be on the green pixels PG. The blue photoelectric elements 140B may be on the blue pixels PB. The red photoelectric elements 140R may be on the red pixels PR.

Each of the green photoelectric elements 140G, the blue photoelectric elements 140B, and the red photoelectric elements 140R may include a photodiode 140. Each of the photodiodes 140 may include a first impurity region 141 and a second impurity region 142. The first impurity region 141 may be adjacent to the insulating interlayer 120. The first impurity region 141 may be between the isolation structures 130. The second impurity region 142 may be on the first impurity region 141. The second impurity region 142 may extend toward an adjacent pixel. For example, the first impurity region 141 may include N type impurities, and the second impurity region 142 may include P type impurities.

The buffer layer 210 may be on the green photoelectric elements 140G, the blue photoelectric elements 140B, and the red photoelectric elements 140R. For example, the buffer layer 210 may directly contact the photodiodes 140. The buffer layer 210 may include an insulating material. For example, the buffer layer 210 may include silicon oxide.

The green color filters 300, the blue color filters 400, and the red color filters 500 may filter an incident light based on wavelengths. For example, a wavelength range of the light passing through the green color filters 300 may be substantially identical to the wavelength range of green light. For example, a wavelength range of the light passing through the blue color filters 400 may be substantially identical to the wavelength range of blue light. For example, a wavelength range of the light passing through the red color filters 500 may be substantially identical to the wavelength range of red light.

The green color filters 300 may be on the green photoelectric elements 140G. The green color filters 300 may be the inorganic color filter (ICF). The green color filters 300 may be a multilayered structure. For example, as may be seen in FIG. 3D, each of the green color filters 300 may include a first green inorganic color filter layer 301, a second green inorganic color filter layer 302, a third green inorganic color filter layer 303, a fourth green inorganic color filter layer 304, a fifth green inorganic color filter layer 305, and a sixth green inorganic color filter layer 306. For example, the first green inorganic color filter layer 301, the second green inorganic color filter layer 302, the third green inorganic color filter layer 303, the fourth green inorganic color filter layer 304, the fifth green inorganic color filter layer 305, and the sixth green inorganic color filter layer 306 may include silicon oxide, silicon nitride or silicon oxynitride, respectively.

The first green inorganic color filter layer 301 may be adjacent to the buffer layer 210. The second green inorganic color filter layer 302 may be on the first green inorganic color filter layer 301. A refractive index of the second green inorganic color filter layer 302 may be different from a refractive index of the first green inorganic color filter layer 301. For example, the second green inorganic color filter layer 302 may have a higher refractive index than that of the first green inorganic color filter layer 301. The third green inorganic color filter layer 303 may be on the second green inorganic color filter layer 302. The third green inorganic color filter layer 303 may have a different refractive index from that of the second green inorganic color filter layer 302. For example, the third green inorganic color filter layer 303 may have a smaller refractive index than that of the second green inorganic color filter layer 302. The third green inorganic color filter layer 303 may have a different refractive index from that of the first green inorganic color filter layer 301. The fourth green inorganic color filter layer 304 may be on the third green inorganic color filter layer 303. The fourth green inorganic color filter layer 304 may have a different refractive index from that of the third green inorganic color filter layer 303. For example, the fourth green inorganic color filter layer 304 may have a greater refractive index than that of the third green inorganic color filter layer 303. The fourth green inorganic color filter layer 304 may have a different refractive index from that of the second green inorganic color filter layer 302. The fifth green inorganic color filter layer 305 may be on the fourth green inorganic color filter layer 304. The fifth green inorganic color filter layer 305 may have a different refractive index from that of the fourth green inorganic color filter layer 304. For example, the fifth green inorganic color filter layer 305 may have a smaller refractive index than that of the fourth green inorganic color filter layer 304. The fifth green inorganic color filter layer 305 may have a different refractive index from that of the third green inorganic color filter layer 303. The sixth green inorganic color filter layer 306 may be on the fifth green inorganic color filter layer 305. The sixth green inorganic color filter layer 306 may have a different refractive index from that of the fifth green inorganic color filter layer 305. The sixth green inorganic color filter layer 306 may have a greater refractive index than that of the third green inorganic color filter layer 303. The refractive index of the sixth green inorganic color filter layer 306 may be different from that of the fourth green inorganic color filter layer 304. Thus, the green color filter 300 may include a stack of alternating high refractive index and low refractive index layers.

A side surface of the first green inorganic color filter layer 301 may be vertically aligned with a side surface of the second green inorganic color filter layer 302. The side surface of the second green inorganic color filter layer 302 may be vertically aligned with a side surface of the third green inorganic color filter layer 303. The side surface of the third green inorganic color filter layer 303 may be vertically aligned with a side surface of the fourth green inorganic color filter layer 304. The side surface of the fourth green inorganic color filter layer 304 may be vertically aligned with a side surface of the fifth green inorganic color filter layer 305. The side surface of the fifth green inorganic color filter layer 305 may be vertically aligned with a side surface of the sixth green inorganic color filter layer 306.

An upper surface of each of the green color filters 300 may have a smaller horizontal width than the lower surface of each of the green color filters 300. For example, a side surface of each of the green color filters 300 may be inclined. However, side surfaces of the first to six green inorganic color filter layers may form a continuous side surface of the green color filter 300.

An area of a lower surface of each of the green color filters 300 may be smaller than an area of the green pixel PG. A horizontal width of the lower surface of each of the green color filters 300 may be smaller than a horizontal width of the lower surface of the corresponding green pixel PG.

The blue color filters 400 may be on the blue photoelectric elements 140B. The blue color filters 400 may be an organic color filter (OCF). The blue color filters 400 may be a monolayered structure. For example, the blue color filters 400 may include a photoresist or a resin. The blue color filters 400 may include a pigment absorbing light having wavelengths corresponding to various colors except blue.

An area of a lower surface of each of the blue color filters 400 may be smaller than an area of the corresponding blue pixel PB. The lower surface of each of the blue color filters 400 may have substantially the same area as the lower surface of each of the green color filters 300. A horizontal width of the lower surface of each of the blue color filters 400 may be smaller than a horizontal width of the corresponding blue pixel PB. The lower surface of each of the blue color filters 400 may have substantially the same horizontal width as the lower surface of each of the green color filters 300.

A horizontal width of an upper surface of each of the blue color filters 400 may be greater than a horizontal width of the lower surface of each of the blue color filters 400. For example, the upper surface of each of the blue color filters 400 may have substantially the same horizontal width as that of the corresponding blue pixel PB. An area of the upper surface of each of the blue color filters 400 may be substantially same as the area of the lower surface of each of the blue color filters 400. For example, the upper surface of each of the blue color filters 400 may have substantially the same area as that of the corresponding blue pixel PB.

The red color filters 500 may be on the red photoelectric elements 140R. The red color filters 500 may be an organic color filter (OCF). The red color filters 500 may be a monolayered structure. For example, the red color filters 500 may include a photoresist or a resin. The red color filters 500 may include a pigment absorbing light having wavelengths corresponding to various colors except red.

An area of a lower surface of each of the red color filters 500 may be smaller than an area of the corresponding red pixel PR. The lower surface of each of the red color filters 500 may have substantially the same area as the lower surface of each of the green color filters 300. A horizontal width of the lower surface of each of the red color filters 500 may be smaller than a horizontal width of the corresponding red pixel PR. The lower surface of each of the red color filters 500 may have substantially the same horizontal width as the lower surface of each of the green color filters 300.

A horizontal width of an upper surface of each of the red color filters 500 may be greater than a horizontal width of the lower surface of each of the red color filters 500. An area of the upper surface of each of the red color filters 500 may be greater than an area of the lower surface of each of the red color filters 500. For example, the upper surface of each of the red color filters 500 may have substantially the same area as that of the corresponding red pixel PB.

In the image sensor in accordance with the example embodiment, the green pixels PG may be arranged in the zigzag shape, and the green color filters 300 may be the inorganic color filter. However, in the image sensor in accordance with some example embodiment, the red pixels PR may be arranged in the zigzag shape, and the red color filters 400 may be inorganic color filters. In the image sensor in accordance with another example embodiment, the blue pixels PB may be arranged in the zigzag shape, and the blue color filters 500 may be inorganic color filters.

The metal pattern 600 may be disposed among the green color filters 300, the blue color filters 400, and the red color filters 500. The metal pattern 600 may be disposed among the green pixels PG, the blue pixels PB, and the red pixels PR. The green color filters 300, the blue color filters 400, and the red color filters 500 may be surrounded by the metal pattern 600. For example, the metal pattern 600 may be a mesh shape or a grid shape.

A maximum thickness of the metal pattern 600 may be substantially the same as a vertical thickness of the green color filters 300, e.g., along a third direction. A level of an upper end of the metal pattern 600 may be substantially same as a level of the upper surface of the green color filters 300.

The green color filters 300 may be between the metal pattern 600. The green color filters 300 may be spaced apart from the blue color filters 400 and the red color filters 500 by the metal pattern 600.

The vertical thickness of the metal pattern 600 may be decreased as a distance from the green color filters 300 is increased. A horizontal width of an upper portion of the metal pattern 600 may be smaller than a horizontal width of a lower portion of the metal pattern 600. For example, a cross-section of the metal pattern 600 taken along an imaginary line crossing adjacent green and blue color filters 300 and 400, or crossing adjacent green and red color filters 300 and 500 may have a spacer shape on the side surface of the corresponding green color filter 300.

Lower portions of the green color filters 300, the blue color filters 400, and the red color filters 500 may be spaced apart from each other by the metal pattern 600. An upper portion of the blue color filters 400 may extend onto the metal pattern 600. A level of the upper surface of the blue color filters 400 may be higher than a level of the upper end of the metal pattern 600. The upper portion of the red color filters 500 may extend onto the metal pattern 600. A level of the upper surface of the red color filters 500 may be higher than the level of the upper end of the metal pattern 600. The upper portion of the red color filters 500 may be in directly contact with the upper portion of the blue color filters 400 on the metal pattern 600.

The metal pattern 600 may fill a space between adjacent green color filters 300. The horizontal width of the lower surface of the metal pattern 600 may be greater than half of a distance between adjacent green color filters 300. A cross-section of the metal pattern 600 taken along an imaginary line crossing the adjacent green color filters 300 may have a different shape from the cross-section of the metal pattern 600 taken along the imaginary line crossing the adjacent green and blue color filters 300 and 400, or crossing the adjacent green and red color filters 300 and 500. As shown in FIG. 3B, the cross-section of the metal pattern 600 taken along the imaginary line crossing the adjacent green color filters 300 may have a rectangular shape.

A cross-section of the metal pattern 600 taken along an imaginary line crossing adjacent blue and red color filters 400 and 500 may have a different shape from the cross-section of the metal pattern 600 taken along the imaginary line crossing the adjacent green color filters 300. For example, as shown in FIG. 3C, the cross-section of the metal pattern 600 taken along the imaginary line crossing the adjacent blue and red color filters 400 and 500 may be a semi-circular shape. The cross-section of the metal pattern 600 taken along the imaginary line crossing the adjacent blue and red color filters 400 and 500 may have substantially the same maximum thickness as the cross-section of the metal pattern 600 taken along the imaginary line crossing the adjacent green color filters 300.

The metal pattern 600 may include a metal. For example, the metal pattern 600 may include aluminum (Al), chromium (Cr), molybdenum (Mo), titanium (Ti), or tungsten (W).

The planarization layer 700 may be on the green color filters 300, the blue color filters 400, the red color filters 500, and the metal pattern 600. The planarization layer 700 may include an insulating material.

The microlenses 800 may be on the planarization layer 700. Each of the microlenses 800 may be on each of the green color filters 300, the blue color filters 400, and the red color filters 500. Each of the microlenses 800 may have a greater area than the lower surface of each of the green color filters 300. Each of the microlenses 800 may have a greater horizontal width than the lower surface of each of the green color filters 300.

The image sensor in accordance with the example embodiment includes the inorganic color filters on the pixels arranged in the zigzag shape, the organic color filters between the inorganic color filters, and the metal pattern disposed between the inorganic and organic color filters. In the image sensor in accordance with the example embodiment, the metal pattern may be the mesh shape or the grid shape. Therefore, in the image sensor in accordance with the example embodiment, reliability and electrostatic discharge (ESD) effect may be improved.

Figure 4A:
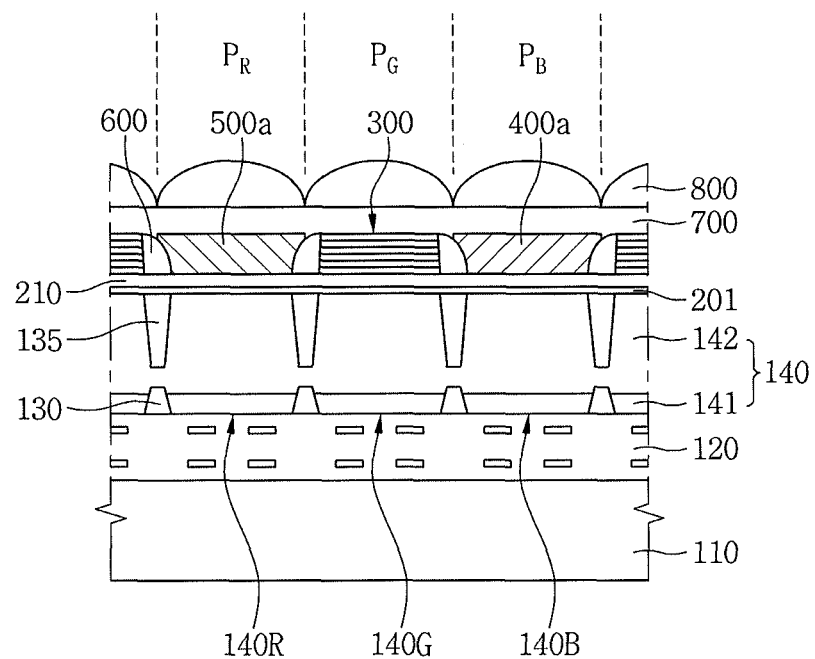
FIGS. 4A to 4C illustrate cross-sectional views showing an image sensor in accordance with embodiments.
Figure 4B:
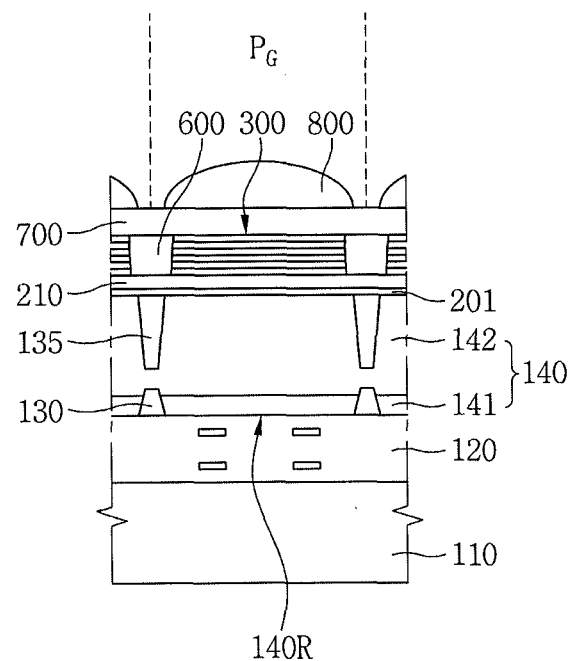
Figure 4C:
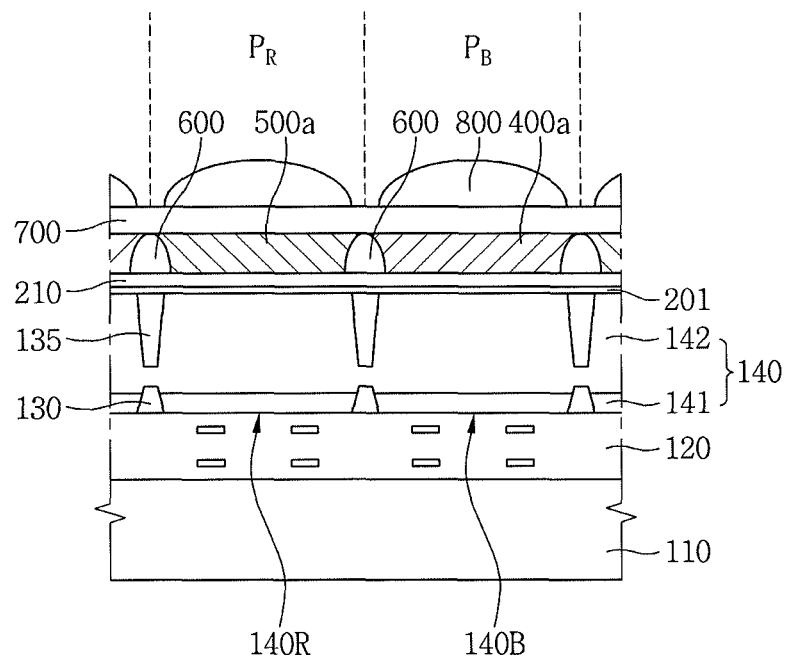

FIGS. 4A to 4C illustrate cross-sectional views showing an image sensor in accordance with embodiments.

Referring to FIGS. 4A to 4C, the image sensor includes the support substrate 110, the insulating interlayer 120, the plurality of isolation structures 130, a plurality of pixel isolation layers 135, the plurality of green photoelectric elements 140G, the plurality of green photoelectric elements 140B, the plurality of red photoelectric elements 140R, the antireflection layer 201, the buffer layer 210, a plurality of green color filters 300, a plurality of blue color filters 400a, a plurality of red color filters 500a, the metal pattern 600, a planarization layer 700, and the plurality of microlenses 800.

The support substrate 110 may include a plurality of green pixels PG, a plurality of blue pixels PB, and a plurality of red pixels PR. Each of the green photoelectric elements 140G, the blue photoelectric elements 140B, and the red photoelectric elements 140R may include a photodiode 140. Each of the photodiodes 140 may include the first impurity region 141 and the second impurity region 142.

The pixel isolation layers 135 may be in the photodiodes 140, e.g., in the second impurity region 142. The pixel isolation layers 135 may be between the green pixels PG, the blue pixels PB, and the red pixels PR. Each of the second impurity regions 142 of the photodiodes 140 may be between the pixel isolation layers 135.

The pixel isolation layers 135 may face the isolation structures 130. The pixel isolation layers 135 may be spaced apart from the isolation structures 130. The pixel isolation layers 135 may include an insulating material. For example, the pixel isolation layers 135 may include silicon oxide.

The antireflection layer 201 may be on the green photoelectric elements 140G, the blue photoelectric elements 140B, and the photoelectric elements 140R. The antireflection layer 201 may be between the photodiodes 140 and the buffer layer 210. The antireflection layer 201 may have a multilayered structure. For example, the antireflection layer 201 may include hafnium oxide (HfO).

The green photoelectric elements 140G and the green color filters 300 may be on the green pixels PG of the support substrate 110. The blue photoelectric elements 140B and the blue color filters 400a may be on the blue pixels PB of the support substrate 110. The red photoelectric elements 140R and the red color filters 500a may be on the red pixels PR of the support substrate 110.

The green color filters 300 may include inorganic color filters (ICF). The blue color filters 400a and the red color filters 500a may include organic color filters (OCF).

An upper surface of the blue color filter 400a may have substantially the same level as an upper surface of the green color filter 300. An upper surface of the red color filter 500a may have substantially the same level as the upper surface of the green color filter 300. As shown in FIGS. 4B and 4C, the cross-section of the metal pattern 600 may be different for adjacent green color filters than between adjacent blue and red color filters.

Figure 5A:
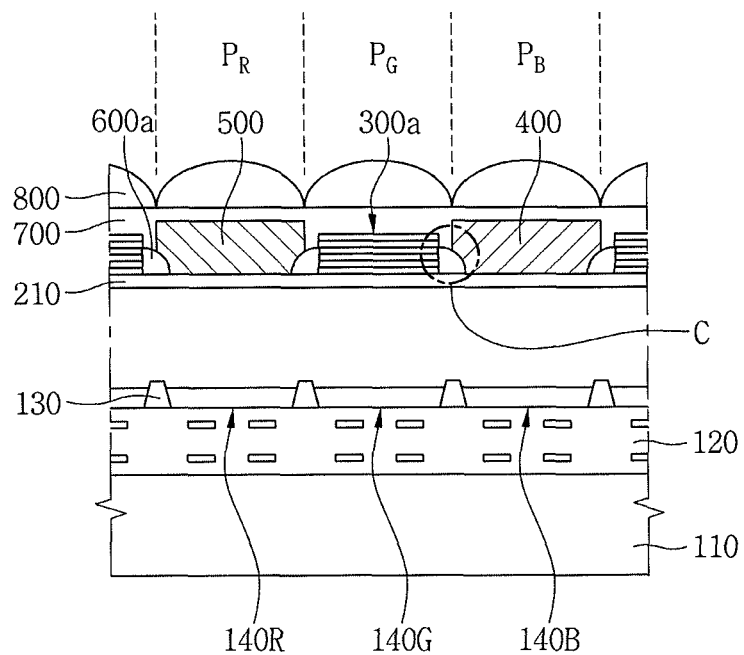
FIG. 5A to 5C illustrate cross-sectional views showing an image sensor in accordance with embodiments.
Figure 5B:
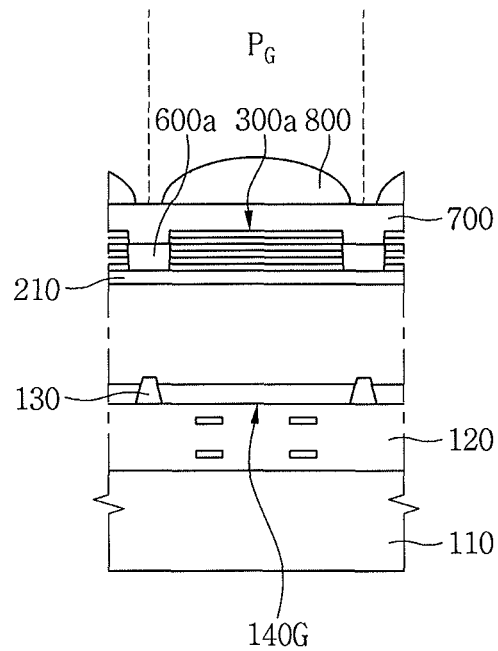
Figure 5C:
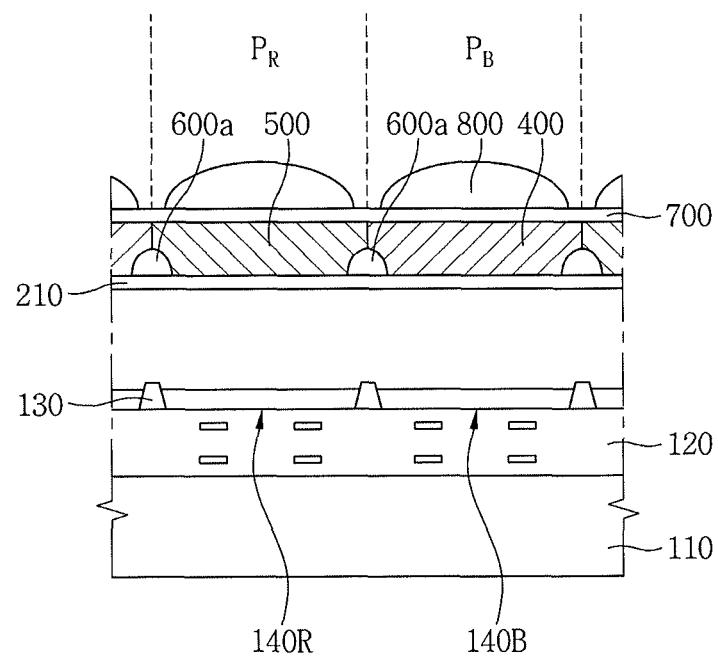
Figure 5D:
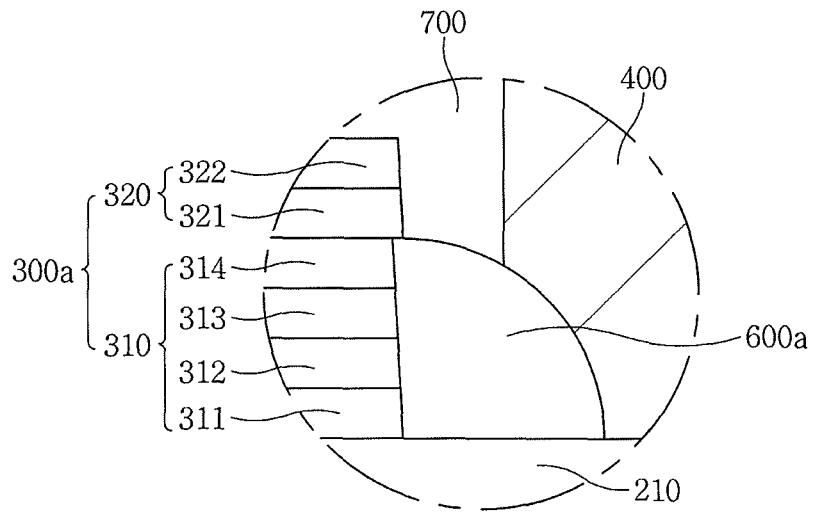
FIG. 5D illustrates an enlarged cross-sectional view of a portion 'C' shown in FIG. 5A.

FIG. 5A to 5C illustrate cross-sectional views showing an image sensor in accordance with embodiments. FIG. 5D illustrates an enlarged cross-sectional view of a portion 'C' shown in FIG. 5A.

Referring to FIGS. 5A to 5C, the image sensor includes the support substrate 110 having the plurality green pixels PG, the plurality of blue pixels PB, and the plurality of red pixels PR, the insulating interlayer 120, the plurality of isolation structures 130, the plurality of green photoelectric elements 140G, the plurality of blue photoelectric elements 140B, the plurality of red photoelectric elements 140R, the buffer layer 210, a plurality of green color filters 300a, the plurality of blue color filters 400, the plurality of red color filters 500, a metal pattern 600a, the planarization layer 700, and the plurality of microlenses 800.

Each of the green color filters 300a may include a lower green inorganic color filter 310 and an upper green inorganic color filter 320. The upper green inorganic color filter 320 may be on the lower green inorganic color filter 310. The upper green inorganic color filter 320 may have a different thickness from the lower green inorganic color filter 310. For example, the upper green inorganic color filter 320 may have a smaller vertical thickness, e.g., along the third direction, than the lower green inorganic color filter 310.

The lower green inorganic color filter 310 may have a multilayered structure. For example, the lower green inorganic color filter 310 may include a first lower green inorganic color filter layer 311, a second lower green inorganic color filter layer 312, a third lower green inorganic color filter layer 313, and a fourth lower green inorganic color filter layer 314.

The first lower green inorganic color filter layer 311 may be adjacent to a corresponding green photoelectric element 140G. The second lower green inorganic color filter layer 312 may be on the first lower green inorganic color filter layer 311. The third lower green inorganic color filter layer 313 may be on the second lower green inorganic color filter layer 312. The fourth lower green inorganic color filter layer 314 may be on the third lower green inorganic color filter layer 313. The first to fourth lower green inorganic color filter layers 311 to 314 may have different refractive indexes. Side surfaces of the first to fourth lower green inorganic color filter layers 311 to 314 may be vertically aligned.

A lower surface of the lower green inorganic color filter 310 may have substantially the same area as a lower surface of each of the blue color filters 400. The lower surface of the lower green inorganic color filter 310 may have a smaller area than a lower surface of each of the microlenses 800. An upper surface of the lower green inorganic color filter 310 may have a smaller area than the lower surface of the lower green inorganic color filter 310.

The upper green inorganic color filter 320 may have a multilayered structure. For example, the upper green inorganic color filter 320 may include a first upper green inorganic color filter 321 and a second upper green inorganic color filter 322.

The first upper green inorganic color filter 321 may be adjacent to the lower green inorganic color filter 310. The second upper green inorganic color filter 322 may be adjacent to the first upper green inorganic color filter 321. The second upper green inorganic color filter 322 may have a different refractive index from the first upper green inorganic color filter 321. A side surface of the second upper green inorganic color filter 322 and a side surface of the first upper green inorganic color filter 321 may be vertically aligned.

A side surface of the upper green inorganic color filter 320 may not be vertically aligned with that of the lower green inorganic color filter 310. For example, a lower surface of the upper green inorganic color filter 320 may have a greater area than an upper surface of the lower green inorganic color filter 310. For example, the lower surface of the upper green inorganic color filter 320 may have substantially the same horizontal width as the lower surface of the lower green inorganic color filter 310.

An surface end of the metal pattern 600a may have substantially the same level as the upper surface of the lower green inorganic color filter 310. The metal pattern 600a may directly contact a side surface of the lower green inorganic color filter 310. For example, the lower surface of the upper green inorganic color filter 320 may extend onto the metal pattern 600a. The upper portion of the metal pattern 600a may be partially covered by the upper green inorganic color filter 320.

Figure 6A:
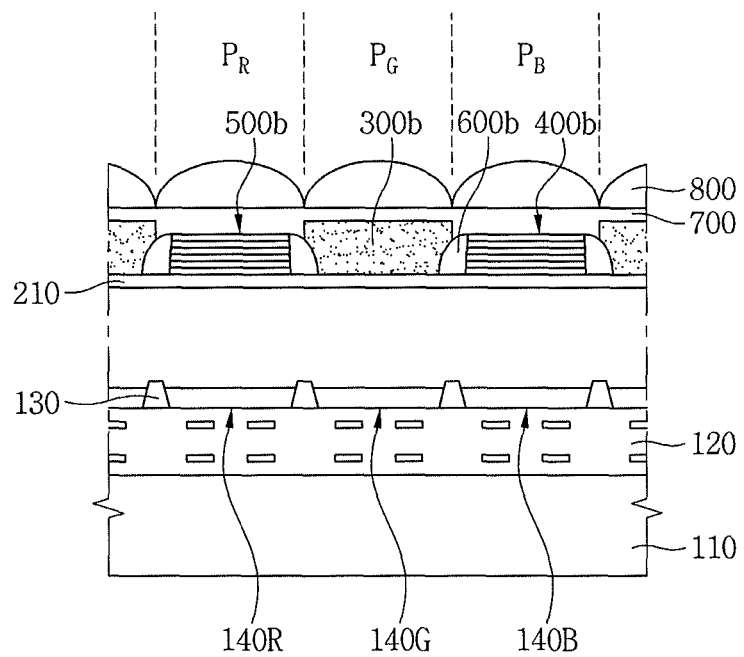
FIGS. 6A to 6C illustrate cross-sectional views showing an image sensor in accordance with embodiments.
Figure 6B:
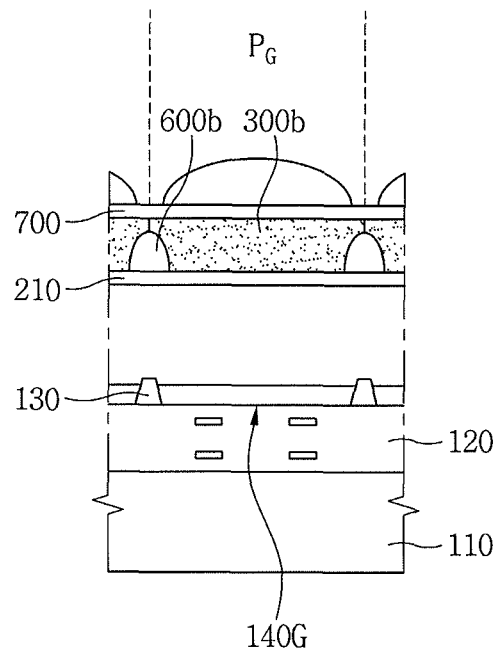
Figure 6C:
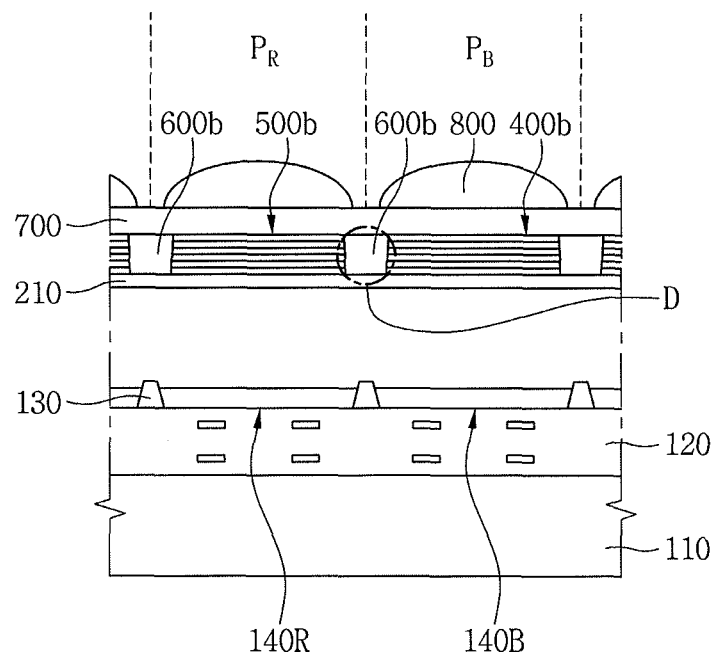
Figure 6D:
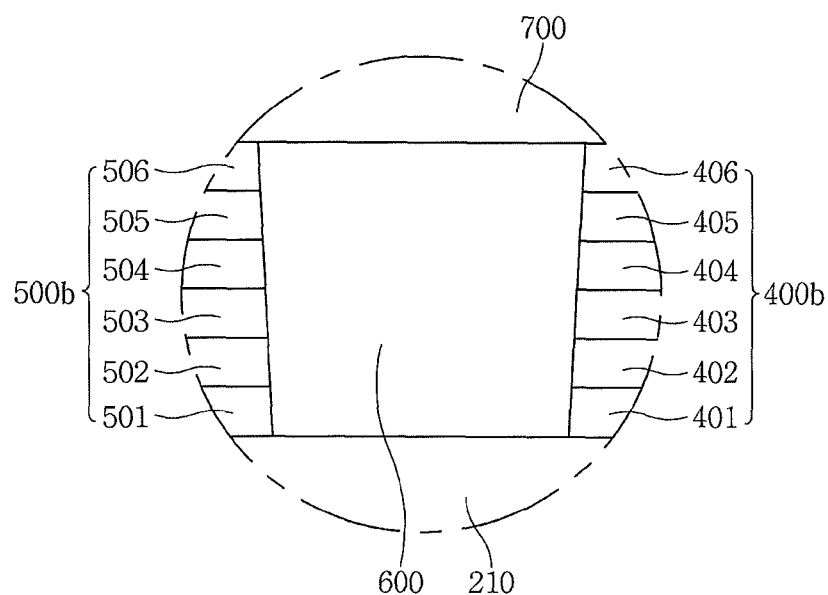
FIG. 6D illustrates an enlarged cross-sectional view of a portion 'D' shown in FIG. 6C.

FIGS. 6A to 6C illustrate cross-sectional views showing an image sensor in accordance with embodiments. FIG. 6D illustrates an enlarged cross-sectional view of a portion 'D' shown in FIG. 6C.

Referring to FIGS. 6A to 6D, the image sensor may include the support substrate 110 having the plurality of green pixels PG, the plurality of blue pixels PB and the plurality of red pixels PR, the insulating interlayer 120, the plurality of isolation structures 130, the plurality of green photoelectric elements 140G, the plurality of blue photoelectric elements 140B, the plurality of red photoelectric elements 140R, the buffer layer 210, a plurality of green color filters 300b, a plurality of blue color filters 400b, a plurality of red color filters 500b, a metal pattern 600b, the planarization layer 700, and the plurality of microlenses 800.

Each of the green color filters 300b may include an organic color filter. The blue color filters 400b and the red color filters 500b may include inorganic color filters. An upper surface of the green color filter 300b may have a higher level than an upper surface of the blue color filter 400b. An upper surface of the red color filter 500b may have substantially the same level as the upper surface of the blue color filter 400b.

The blue color filter 400b may have a multilayered structure. For example, as shown in FIG. 6D, the blue color filter 400b may include a first blue inorganic color filter layer 401, a second blue inorganic color filter layer 402, a third blue inorganic color filter layer 403, a fourth blue inorganic color filter layer 404, a fifth blue inorganic color filter layer 405, and a sixth blue inorganic color filter layer 406. The first to sixth blue inorganic color filter layers 401 to 406 may have different refractive indexes. Side surfaces of the first to sixth blue inorganic color filter layers 401 to 406 may be vertically aligned.

The red color filter 500b may have a multilayered structure. For example, the red color filter 500b may include a first red inorganic color filter layer 501, a second red inorganic color filter layer 502, a third red inorganic color filter layer 503, a fourth red inorganic color filter layer 504, a fifth red inorganic color filter layer 505, and a sixth red inorganic color filter layer 506. The first to sixth red inorganic color filter layers

501 to 506 may have different refractive indexes. Side surfaces of the first to sixth red inorganic color filter layers 501 to 506 may be vertically aligned.

A cross-section of the metal pattern 600b taken along an imaginary line connecting a point between adjacent green and blue color filters 300b and 400b and a point between adjacent green and red color filters 300b and 500b may have a spacer shape disposed on the blue color filter 400b or the red color filter 500b. The metal pattern 600b may fill a space between adjacent blue and red color filters 400b and 500b. A cross-section of the metal pattern 600b taken along an imaginary line passing through the space between the blue and red color filters 400b and 500b may have a rectangular shape. A cross-section of the metal pattern 600b taken along an imaginary line passing through a space between adjacent green color filters 300b may have a semicircular shape.

Figure 7A:
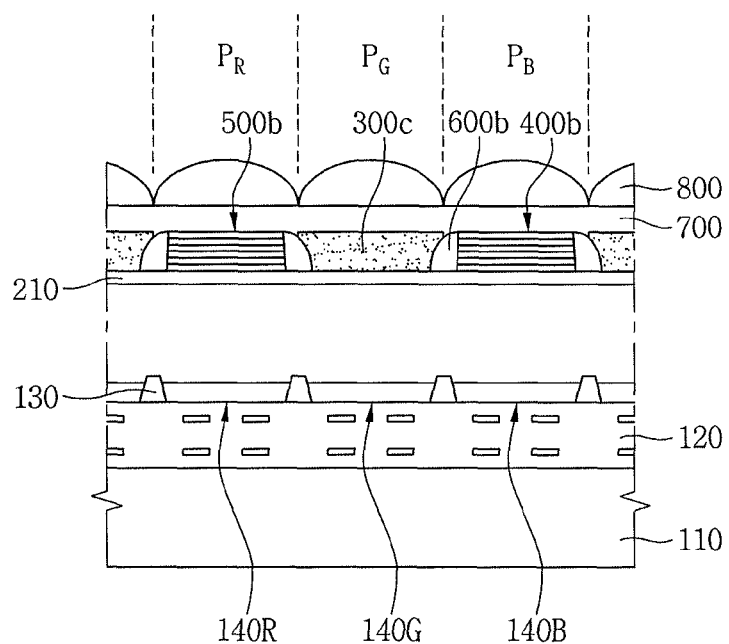
FIGS. 7A to 7C illustrate cross-sectional views showing an image sensor in accordance with embodiments.
Figure 7B:
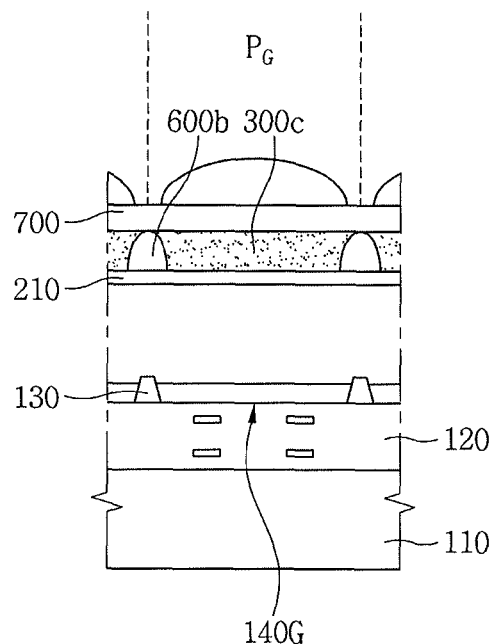
Figure 7C:
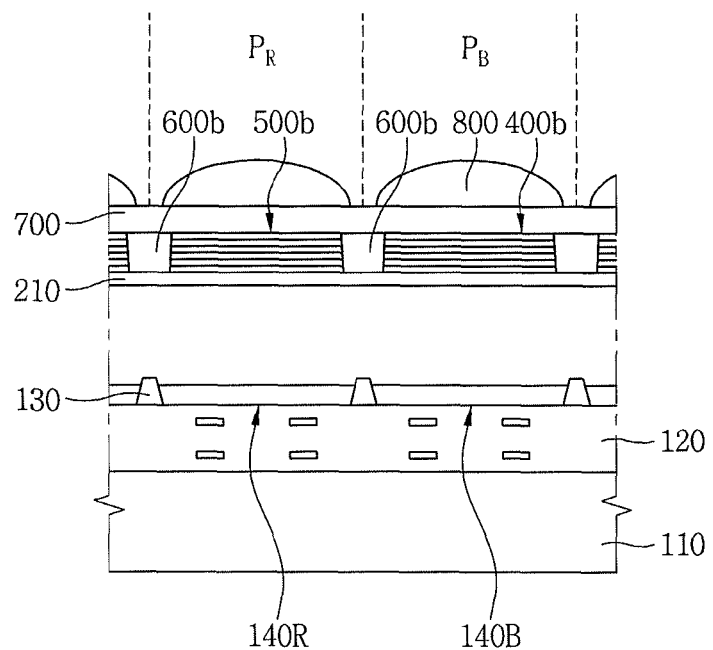

FIGS. 7A to 7C are cross-sectional views showing an image sensor in accordance with embodiments.

Referring to FIGS. 7A to 7C, the image sensor may include the support substrate 110 having the plurality of green pixels PG, the plurality of blue pixels PB, and the plurality of red pixels PR, the insulating interlayer 120, the plurality of isolation structures 130, the plurality of green photoelectric elements 140G, the plurality of blue photoelectric elements 140B, the plurality of red photoelectric elements 140R, the buffer layer 210, a plurality of green color filters 300c, the plurality of blue color filters 400b, the plurality of red color filters 500b, the metal pattern 600b, the planarization layer 700, and the plurality of microlenses 800.

Each of the green color filters 300c may include an organic color filter. The blue color filters 400b and the red color filters 500b may include inorganic color filters. An upper surface of the green color filter 300c may have substantially the same level as an upper surface of the blue color filter 400b. The upper surface of the green color filter 300c may have substantially the same level as an upper surface of the red color filter 500b.

Figure 8A:
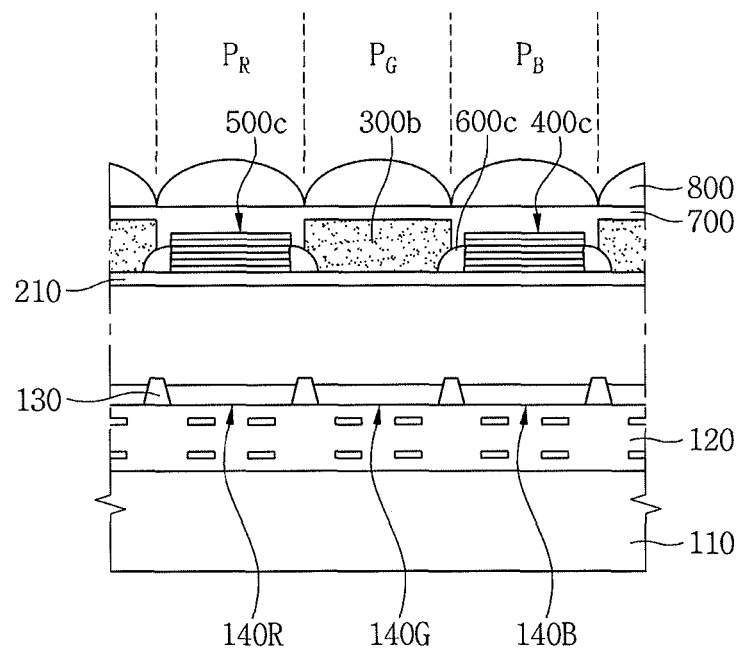
FIGS. 8A to 8C illustrate cross-sectional views showing an image sensor in accordance with embodiments.
Figure 8B:
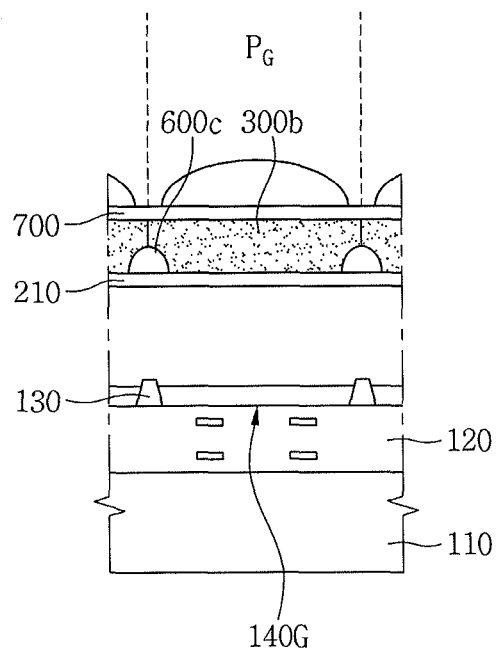
Figure 8C:
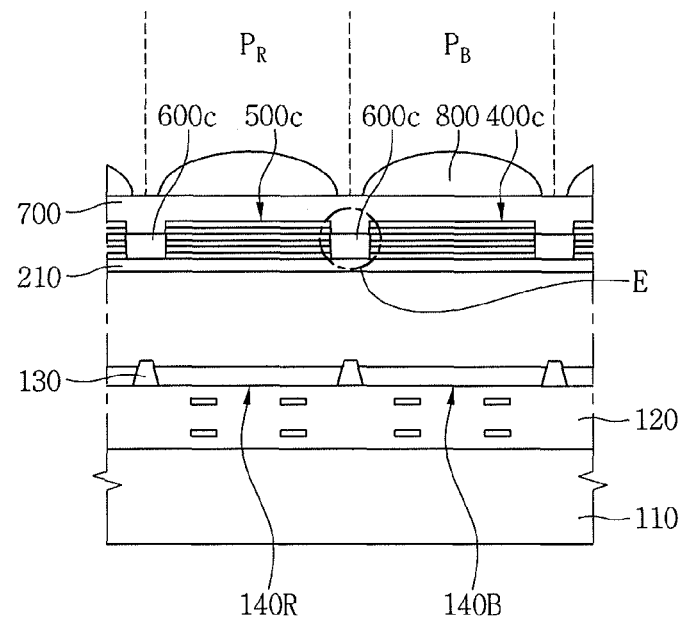
Figure 8D:
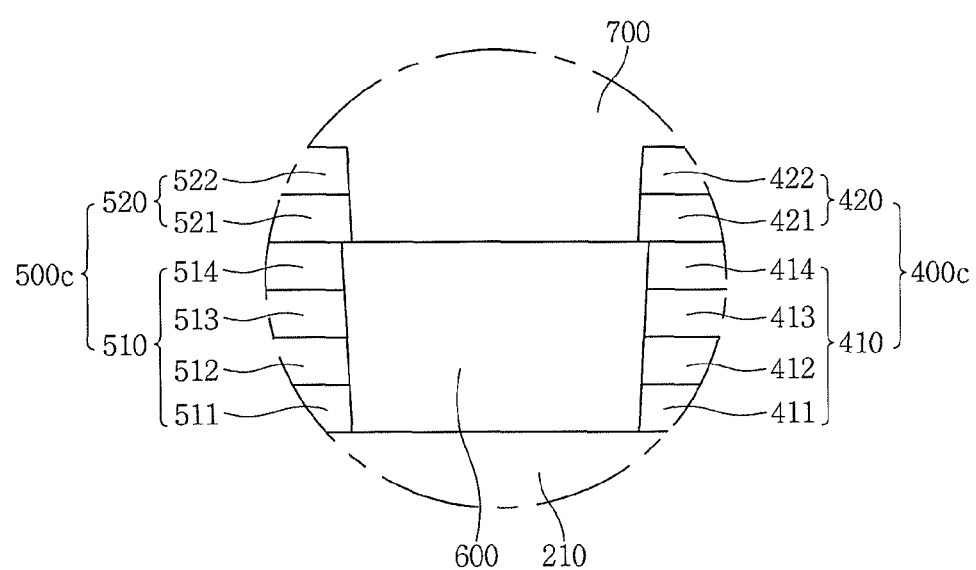
FIG. 8D illustrates an enlarged cross-sectional view of a portion 'E' shown in FIG. 8C.
Figure 9A:
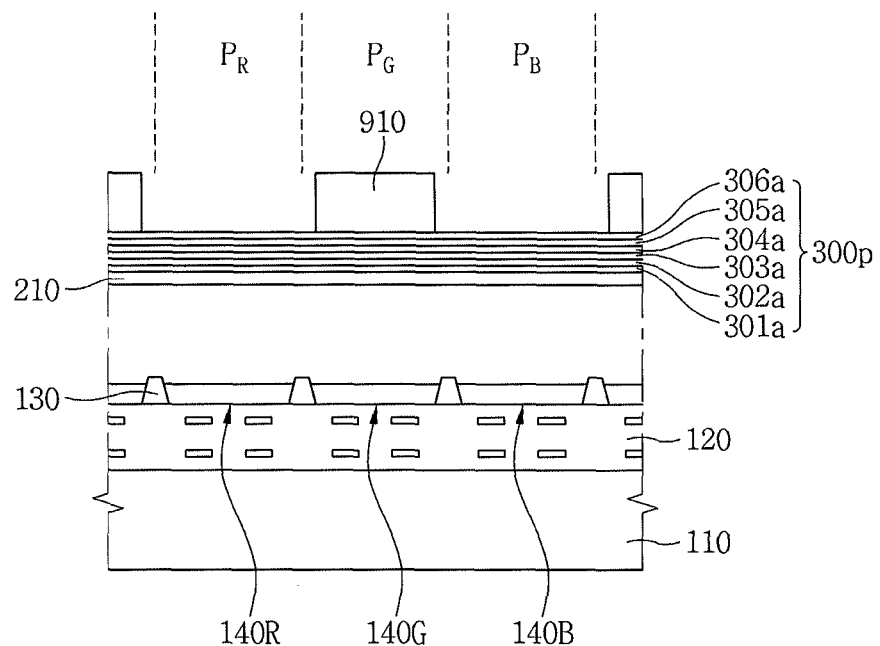
Figure 9B:
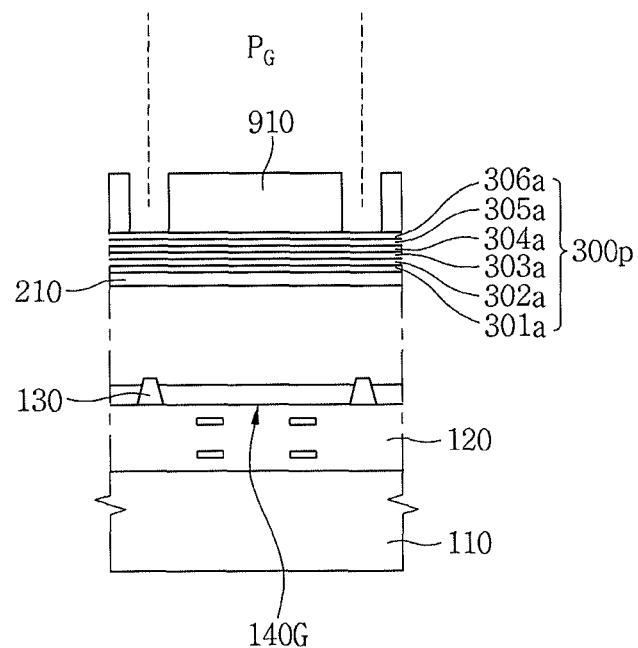
Figure 9C:
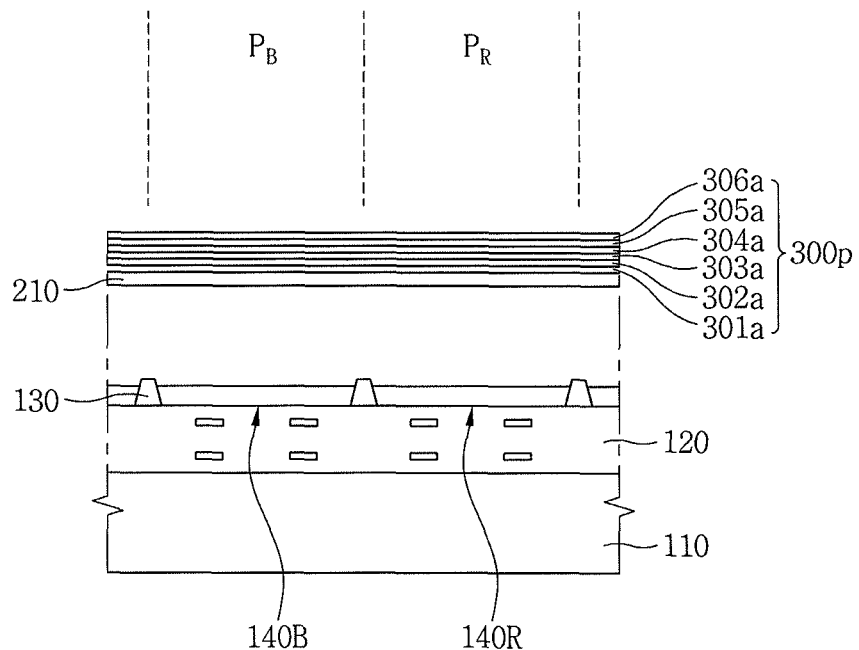

FIGS. 8A to 8C illustrate cross-sectional views showing an image sensor in accordance with embodiments. FIG. 8D illustrates an enlarged cross-sectional view of a portion 'E' shown in FIG. 8C.

Referring to FIGS. 8A to 8D, the image sensor may include the support substrate 110 having the plurality of green pixels PG, the plurality of blue pixels PB, and the plurality of red pixels PR, the insulating interlayer 120, the plurality of isolation structures 130, the plurality of green photoelectric elements 140G, the plurality of blue photoelectric elements 140B, the plurality of red photoelectric elements 140R, the buffer layer 210, the plurality of green color filters 300b, a plurality of blue color filters 400c, a plurality of red color filters 500c, a metal pattern 600c, the planarization layer 700, and the plurality of microlenses 800.

Each of the green color filters 300b may include an organic color filter. The blue color filters 400c and the red color filters 500c may include inorganic color filters.

Each of the blue color filters 400c may include a lower blue inorganic color filter 410 and an upper blue inorganic color filter 420. The upper blue inorganic color filter 420 may be on the lower blue inorganic color filter 410.

The lower blue inorganic color filter 410 may have a multilayered structure. For example, the lower blue inorganic color filter 410 may include a first lower blue inorganic color filter 411, a second lower blue inorganic color filter 412, a third lower blue inorganic color filter 413, and a fourth lower blue inorganic color filter 414. The first to fourth lower blue inorganic color filters 411 to 414 may have different refractive indexes. Side surfaces of the first to fourth lower blue inorganic color filters 411 to 414 may be vertically aligned.

A lower surface of the lower blue inorganic color filter 410 may have substantially the same area as a lower surface of the green color filter 300b. An upper surface of the lower blue inorganic color filter 410 may have a smaller area than the lower surface of the lower blue inorganic color filter 410.

The upper blue inorganic color filter 420 may have a multilayered structure. For example, the upper blue inorganic color filter 420 may include a first upper blue inorganic color filter 421 and a second upper blue inorganic color filter 422. The second upper blue inorganic color filter 422 may have a different refractive index from the first upper blue inorganic color filter 421. A side surface of the second upper blue inorganic color filter 422 and a side surface of the first upper blue inorganic color filter 421 may be vertically aligned.

A lower surface of the upper blue inorganic color filter 420 may not be perpendicularly aligned to a side surface of the lower blue inorganic color filter 410. For example, the lower surface of the upper blue inorganic color filter 420 may have a greater area than the upper surface of the lower blue inorganic color filter 410.

Each of the red color filters 500c may include a lower red inorganic color filter 510 and an upper red inorganic color filter 520. The upper red inorganic color filter 520 may be on the lower red inorganic color filter 510.

The lower red inorganic color filter 510 may have a multilayered structure. For example, the lower red inorganic color filter 510 may include a first lower red inorganic color filter 511, a second lower red inorganic color filter 512, a third lower red inorganic color filter 513, and a fourth lower red inorganic color filter 514. The first to fourth lower red inorganic color filters 511 to 514 may have different refractive indexes. Side surfaces of the first to fourth lower red inorganic color filters 511 to 514 may be vertically aligned.

A lower surface of the lower red inorganic color filter 510 may have substantially the same area as a lower surface of the lower blue inorganic color filter 410. An upper surface of the lower red inorganic color filter 510 may have a smaller area than the lower surface of the lower red inorganic color filter 510. The upper surface of the lower red inorganic color filter 510 may have substantially the same area as an upper surface of the lower blue inorganic color filter 410. The upper surface of the lower red inorganic color filter 510 may have substantially the same level as the upper surface of the lower blue inorganic color filter 410.

The upper red inorganic color filter 520 may have a multilayered structure. For example, the upper red inorganic color filter 520 may include a first upper red inorganic color filter 521 and a second upper red inorganic color filter 522. The second upper red inorganic color filter 522 may have a different refractive index from the first upper red inorganic color filter 521. A side surface of the second upper red inorganic color filter 522 and a side surface of the first upper red inorganic color filter 521 may be vertically aligned.

A side surface of the upper red inorganic color filter 520 may not be vertically aligned with a side surface of the lower red inorganic color filter 510. For example, a lower surface of the upper red inorganic color filter 520 may have substantially the same horizontal width as that of the lower red inorganic color filter 510.

An upper surface of the upper red inorganic color filter 520 may have substantially the same level as an upper surface of the upper blue inorganic color filter 420.

An upper end of the metal pattern 600c may have substantially the same level as the upper surface of the lower blue inorganic color filter 410. The upper end of the metal pattern 600c may have substantially the same level as the upper surface of the lower red inorganic color filter 510. For example, the lower surface of the upper blue inorganic color filter 420 and the lower surface of the upper red inorganic color filter 520 may extend onto the metal pattern 600.

FIGS. 9A to 17A, 9B to 17B and 9C to 17C illustrate cross-sectional views of stages in a method of manufacturing an image sensor in accordance with embodiments.

The method of manufacturing the image sensor will be described with reference to FIGS. 1, 3A to 3E, 9A to 17A, 9B to 17B and 9C to 17C. Firstly, referring to FIGS. 1, 9A to 9C, the method of manufacturing the image sensor includes preparing the support substrate 110 including green pixels PG, blue pixels PB, and red pixels PR, forming a preliminary green inorganic color filter layer 300p on the support substrate 110, and forming a green mask pattern 910 on the preliminary green inorganic color filter layer 300p.

The green pixels PG may be arranged in a zigzag shape. The blue pixels PB and the red pixels PR may be between the green pixels PG. The red pixels PR and the blue pixels PB are arranged in a crisscross. The red pixels PR may be different rows than the blue pixels PB.

The insulating interlayer 120, isolation structures 130, green photoelectric elements 140G, blue photoelectric elements 140B, red photoelectric elements 140R, and the buffer layer 210 may be between the support substrate 110 and the preliminary green inorganic color filter layers 300p.

Forming the preliminary green inorganic color filter layer 300p includes a forming a first preliminary green inorganic color filter layer 301a, forming a second preliminary green inorganic color filter layer 302a on the first preliminary green inorganic color filter layer 301a, forming a third preliminary green inorganic color filter layer 303a on the second preliminary green inorganic color filter layer 302a, forming a fourth preliminary green inorganic color filter layer 304a on the third preliminary green inorganic color filter layer 303a, forming a fifth preliminary green inorganic color filter layer 305a on the fourth preliminary green inorganic color filter layer 304a, and forming a sixth preliminary green inorganic color filter layer 306a on the fifth preliminary green inorganic color filter layer 305a.

The green mask pattern 910 may be formed on the green pixels PG of the support substrate 110. The green mask pattern 910 may partially cover the green pixels PG. For example, a periphery of the green pixels PG may not be overlapped with the green mask pattern 910.

Figure 10A:
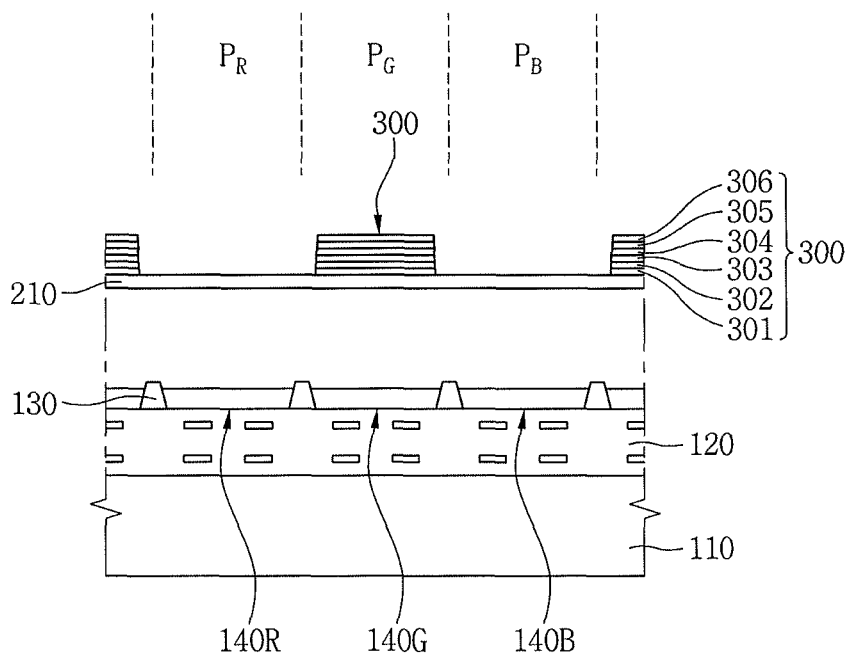
Figure 10B:
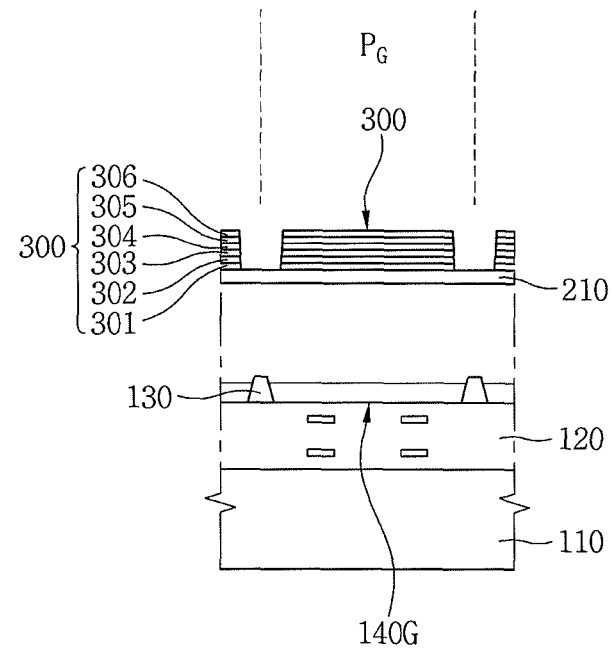
Figure 10C:
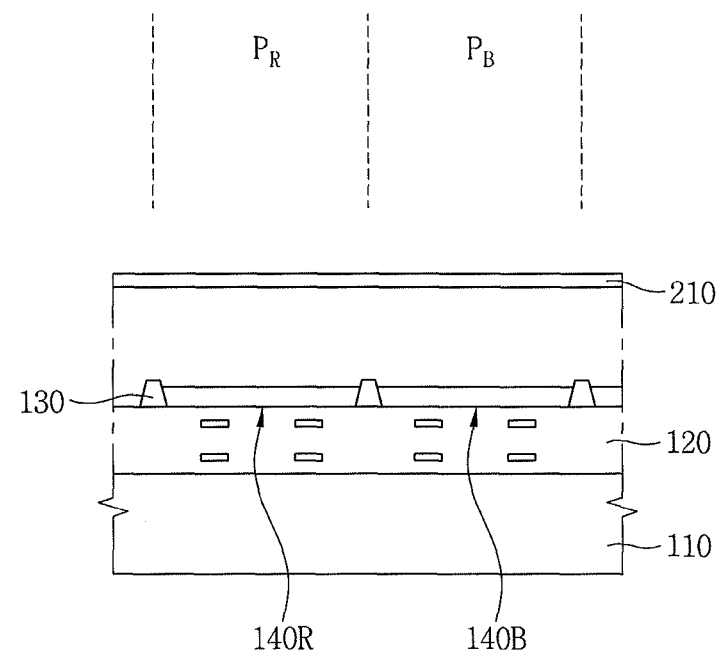

Referring to FIGS. 10A to 10C, the method of manufacturing the image sensor includes forming green color filters 300 on the green pixels PG.

Forming the green color filters 300 may include etching the preliminary green inorganic color filter layer 300p using the green mask pattern 910.

Etching the preliminary green inorganic color filter layer 300p may include etching the first preliminary green inorganic color filter layer 301a to form a first green inorganic color filter layer 301, etching the second preliminary green inorganic color filter layer 302a to form a second green inorganic color filter layer 302, etching the third preliminary green inorganic color filter layer 303a to form a third green inorganic color filter layer 303, etching the fourth preliminary green inorganic color filter layer 304a to form a fourth green inorganic color filter layer 304, etching the fifth preliminary green inorganic color filter layer 305a to form a fifth green inorganic color filter layer 305, and etching the sixth preliminary green inorganic color filter layer 306a to form a sixth green inorganic color filter layer 306.

Forming the green color filters 300 may further include removing the green mask pattern 910 after etching the preliminary green inorganic color filter layer 300a.

Figure 11A:
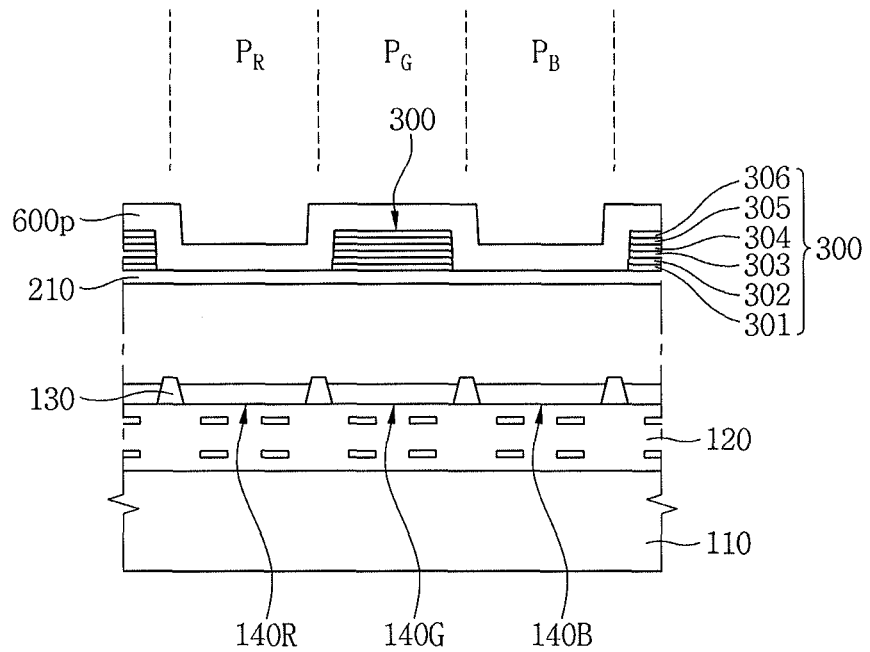
Figure 11B:
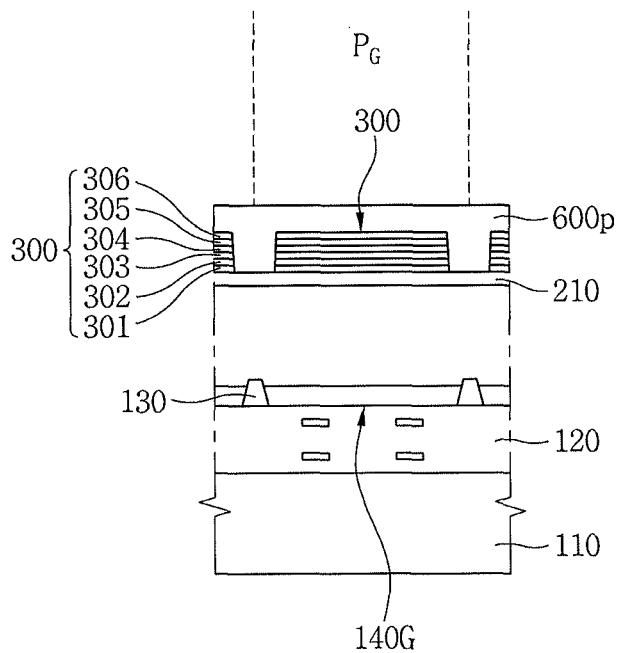
Figure 11C:
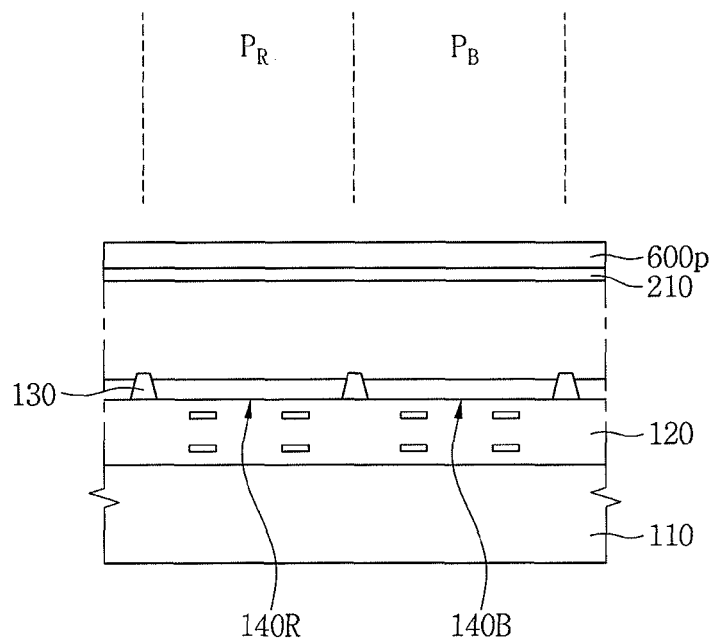

Referring to FIGS. 11A to 11C, the method of manufacturing the image sensor may include forming a metal layer 600a on the green color filters 300.

Forming the metal layer 600a may include filling a space between adjacent green color filters 300 with a metal. For example, forming the metal layer 600a may include forming a layer including aluminum (Al), chromium (Cr), molybdenum (Mo), titanium (Ti), or tungsten (W) on the green color filters 300.

The method of manufacturing the image sensor in accordance with the example embodiment includes forming the green color filters 300, which is inorganic color filter, on the green pixels PG arranged in the zigzag shape, and forming a metal layer 600p on the green color filters 300. In general, the metal layer 600p may be formed at a temperature of about 250° C. An organic color filter including a photoresist or a resin may be degraded at the temperature of the forming of the metal layer 600p. However, the inorganic color filter may not be degraded at the temperature of the forming of the metal layer 600p. Thus, in the method of manufacturing the image sensor in accordance with the example embodiment, the metal layer 600p may be formed without the degradation of the green color filters 300.

Figure 12A:
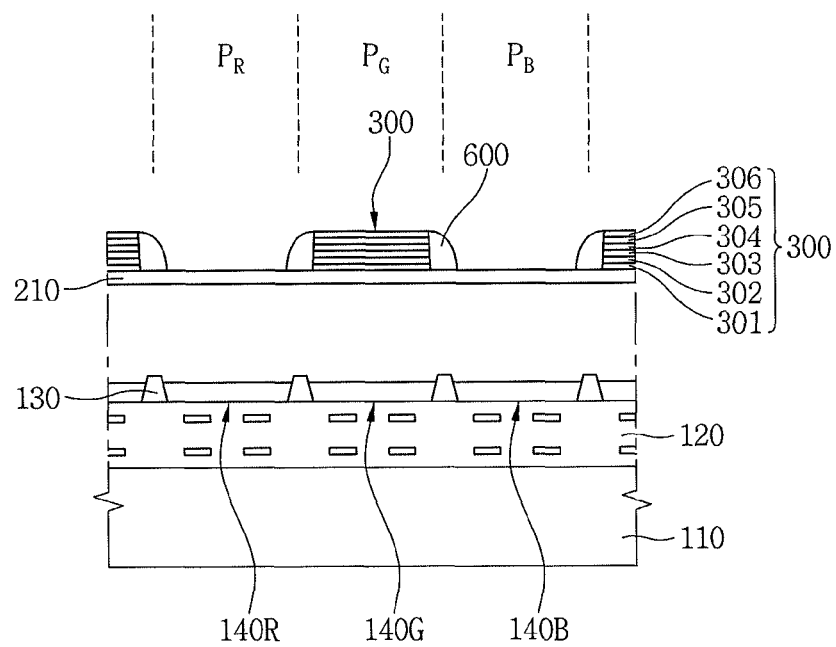
Figure 12B:
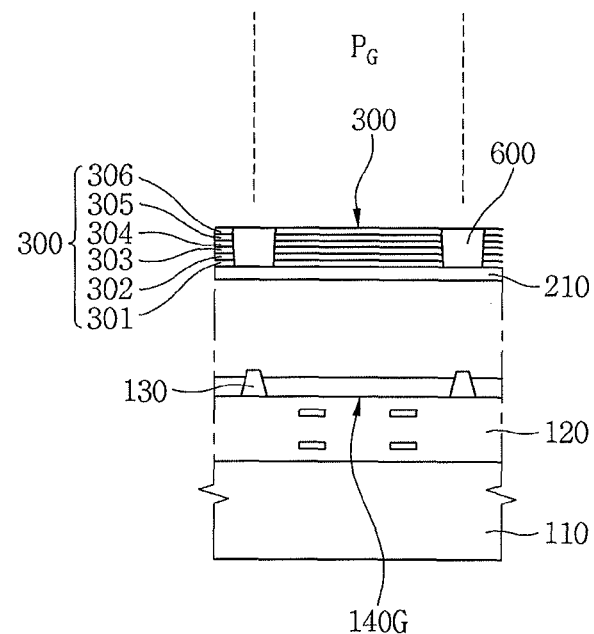
Figure 12C:
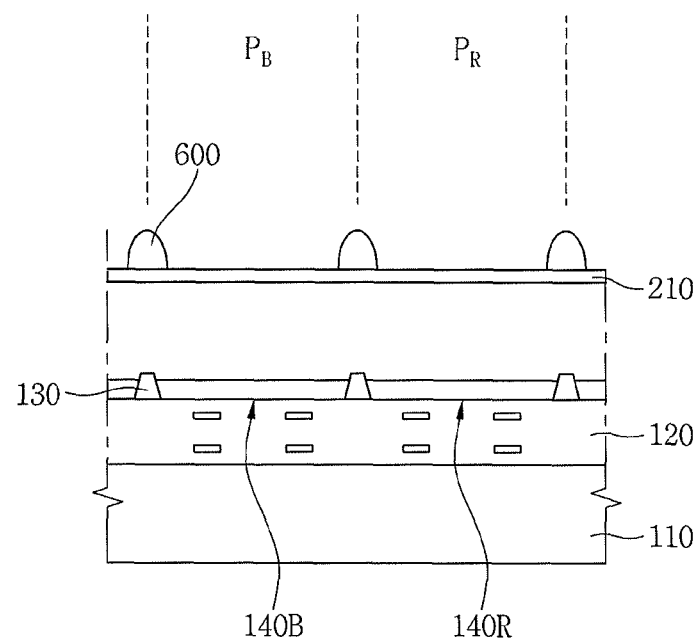

Referring to FIGS. 12A to 12C, the method of manufacturing the image sensor may include forming the metal pattern 600 on side surfaces of the green color filters 300.

Forming the metal pattern 600 may include blanket etching the metal layer 600p. The metal pattern 600 may be formed to have a spacer shape on the side surfaces of the green color filters 300.

In the method of manufacturing the image sensor in accordance with the example embodiment, the green color filters 300 may be formed on the green pixels PG arranged in the zigzag shape. Therefore, the metal pattern 600 on side surfaces of the green color filters 300 may be formed to have a mesh shape or a grid shape. Thus, in the method of manufacturing the image sensor in accordance with the example embodiment, an ESD effect may be improved.

Figure 13A:
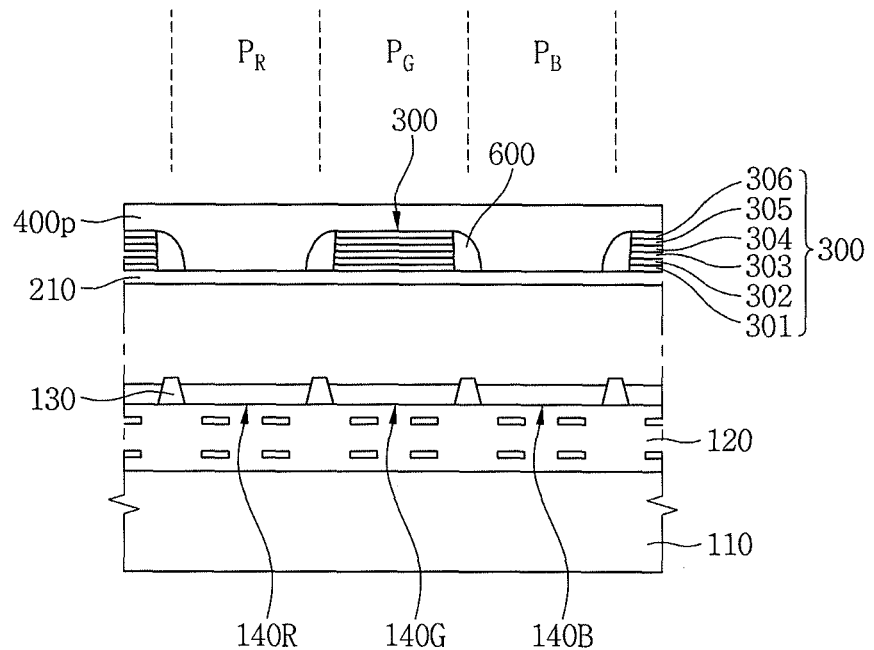
Figure 13B:
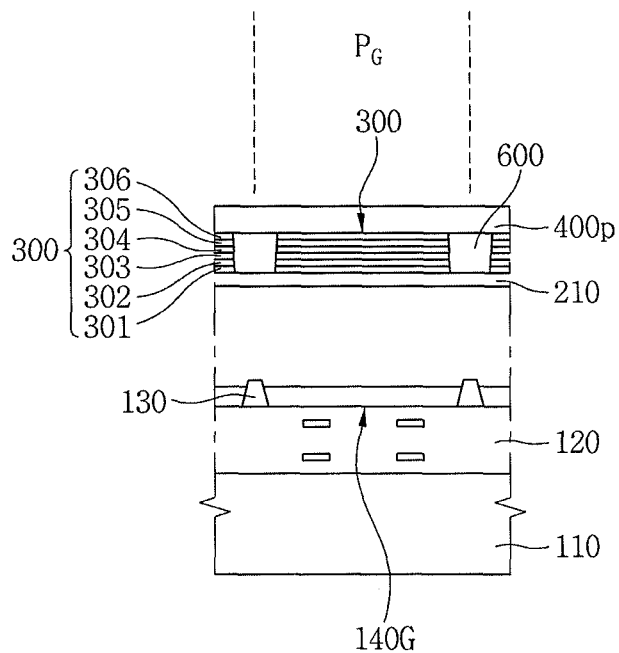
Figure 13C:
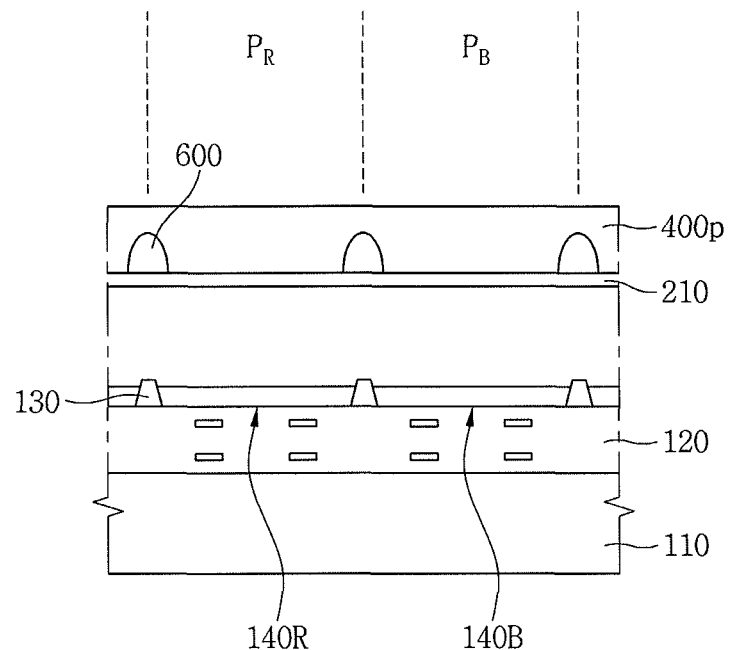

Referring to FIGS. 13A to 13C, the method of manufacturing the image sensor may include forming a first organic color filter layer 400p on the green color filters 300 and the metal pattern 600.

The first organic color filter layer 400p may include a pigment absorbing light having wavelengths corresponding to various colors except blue. The first organic color filter layer 400p may include a photoresist or a resin.

Figure 14A:
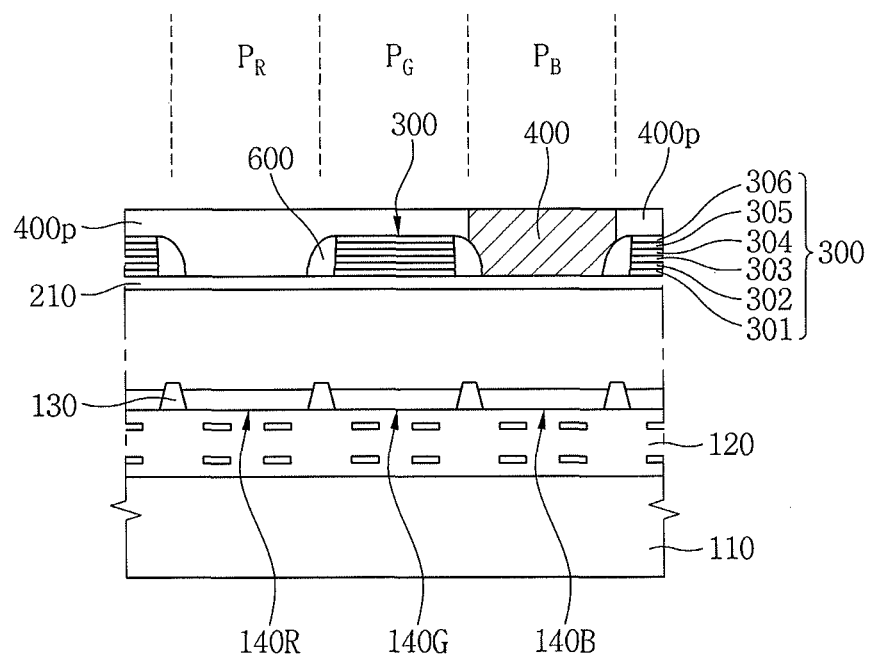
Figure 14B:
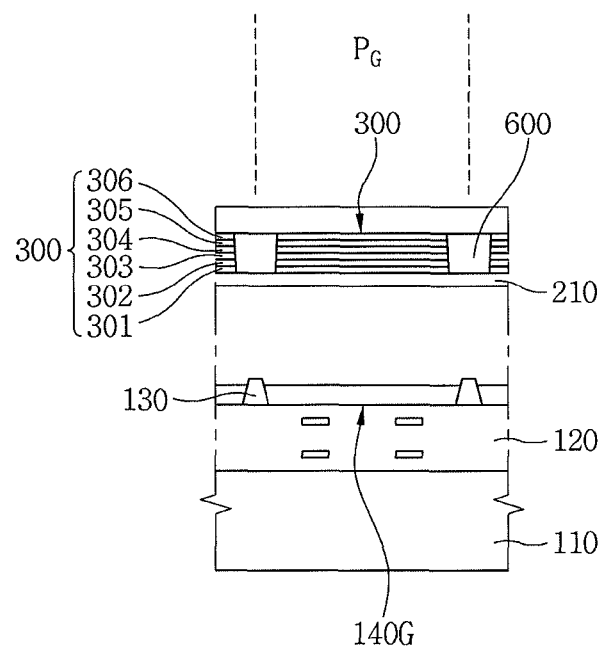
Figure 14C:
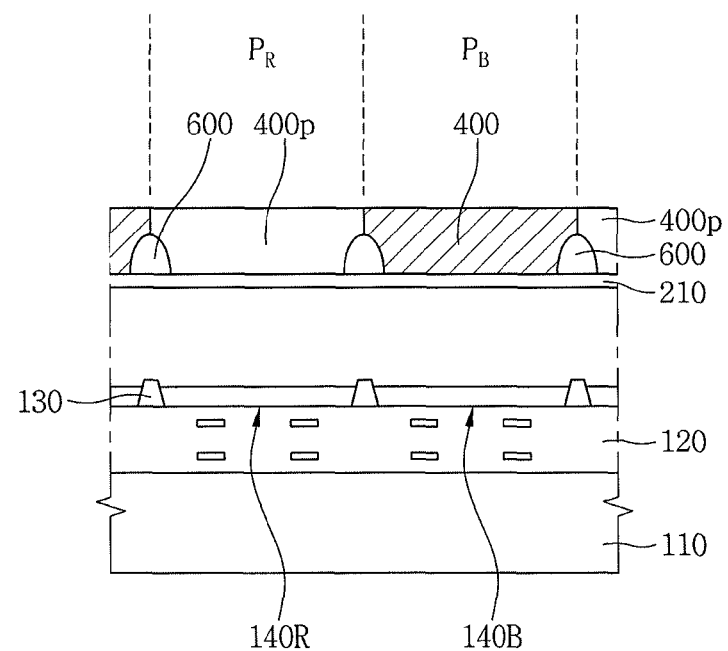

Referring to FIGS. 14A to 14C, the method of manufacturing the image sensor may include forming blue color filters 400 on the blue pixels PB.

Forming the blue color filters 400 may include partially exposing the first organic color filter layer 400a. For example, forming of the blue color filters 400 may include exposing the first organic color filter layer 400a on the blue pixels PB.

Figure 15A:
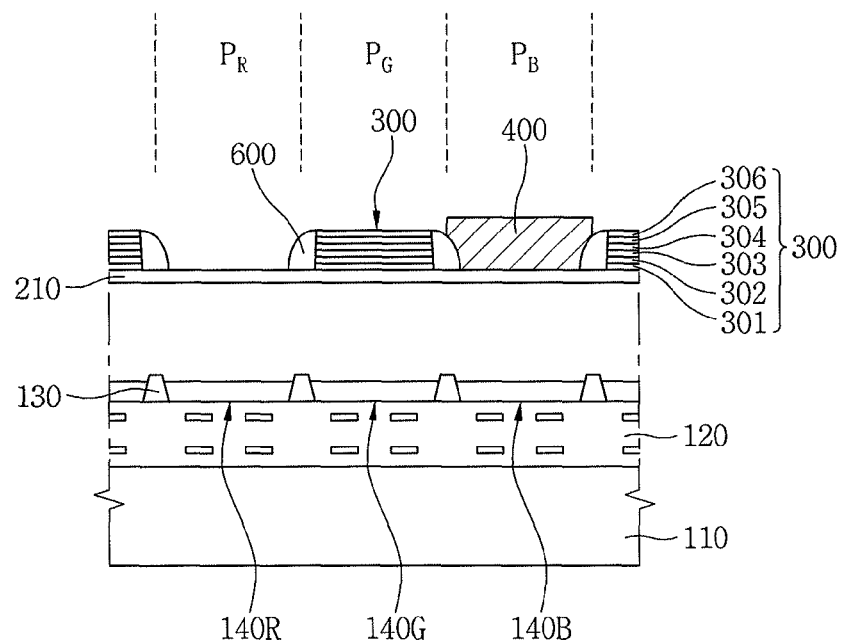
Figure 15B:
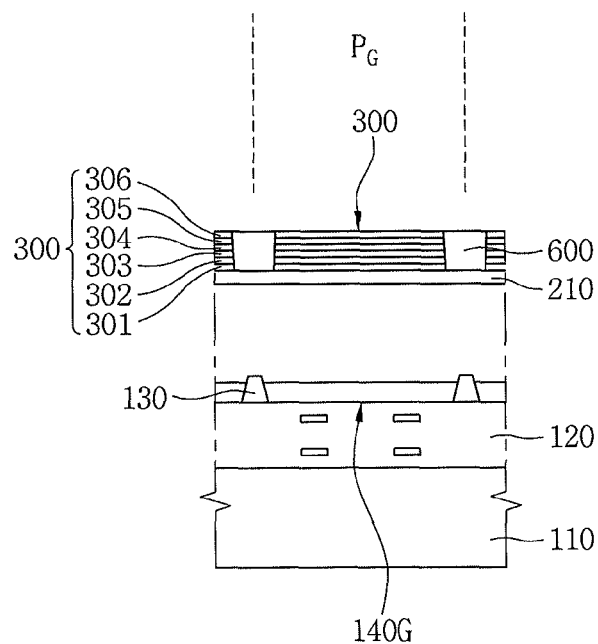
Figure 15C:
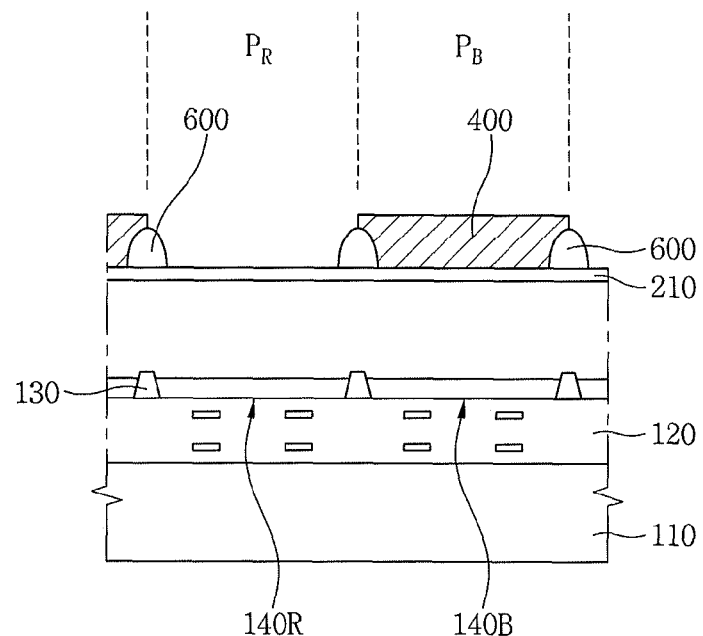

Referring to FIGS. 15A to 15C, the method of manufacturing the image sensor may include removing the first organic color filter layer 400p.

Figure 16A:
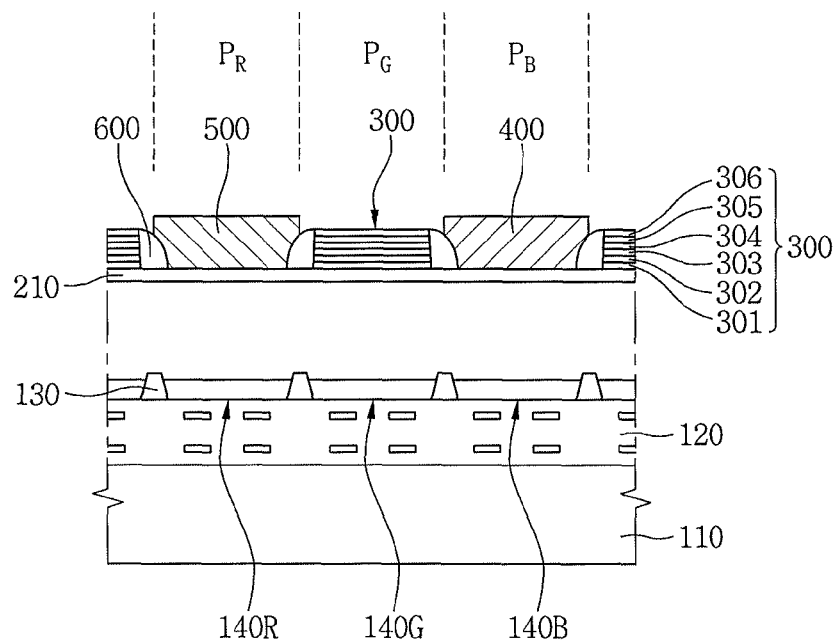
Figure 16B:
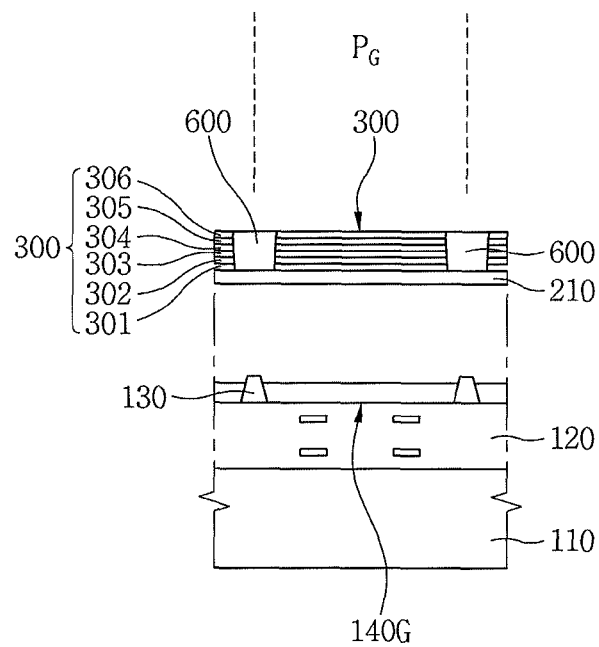
Figure 16C:
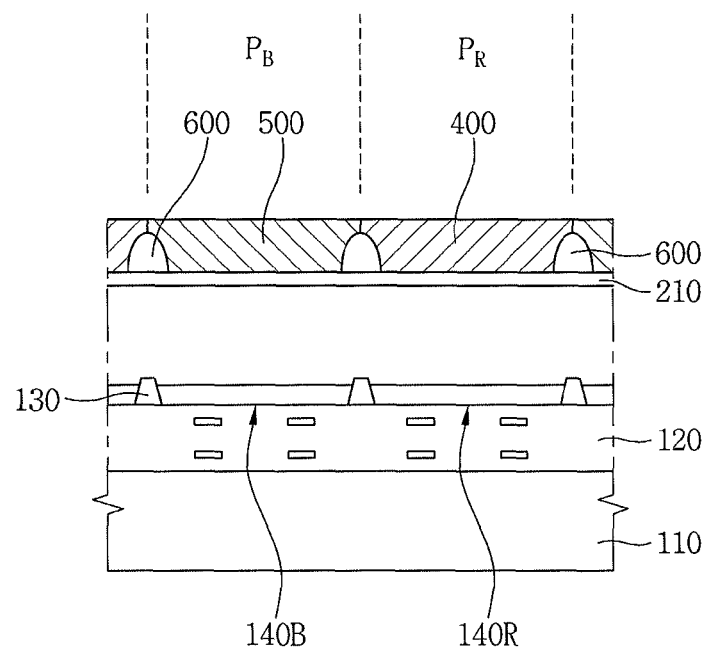

Referring to FIGS. 16A to 16C, the method of manufacturing the image sensor may include forming red color filters 500 on the red pixels PR.

Forming the red color filters 500 may include forming a second organic color filter layer on the green color filters 300, the metal pattern 600, and the blue color filters 400, partially exposing the second organic color filter layer, and removing the un-exposed second organic color filter layer. The second organic color filter layer may include a pigment absorbing light having wavelengths corresponding to various colors except red.

Figure 17A:
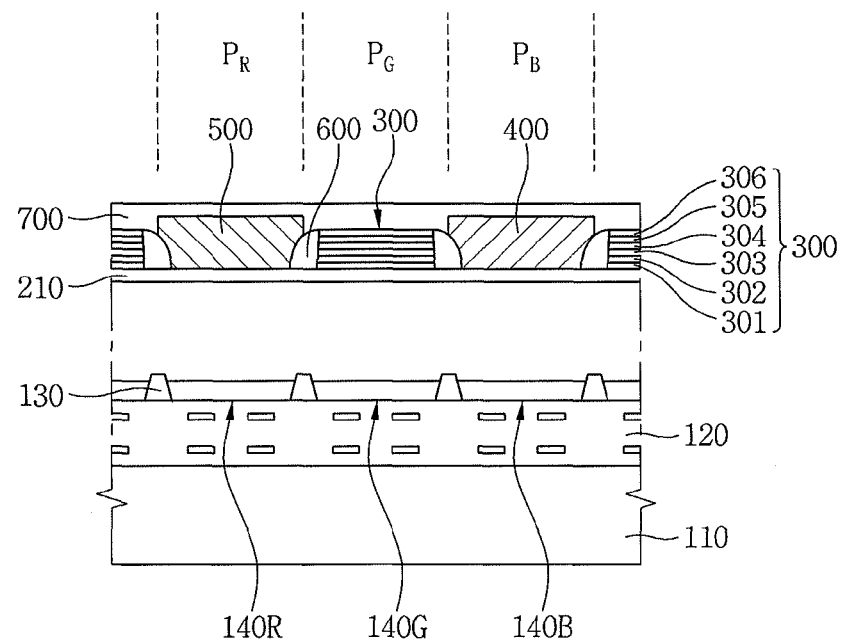
Figure 17B:
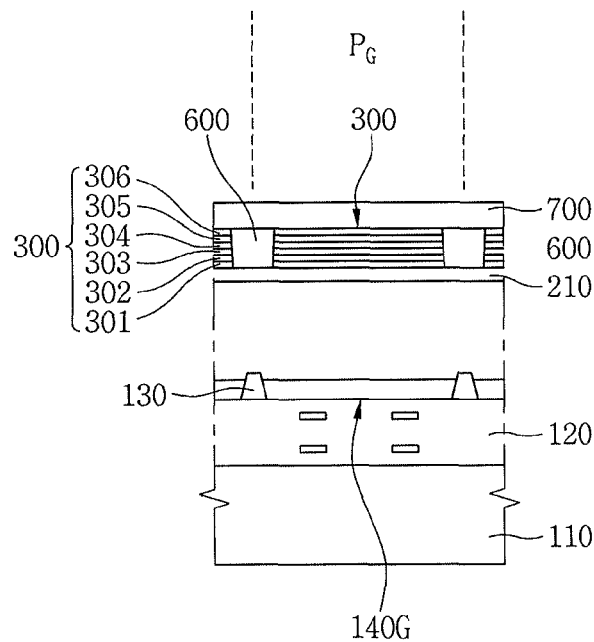
Figure 17C:
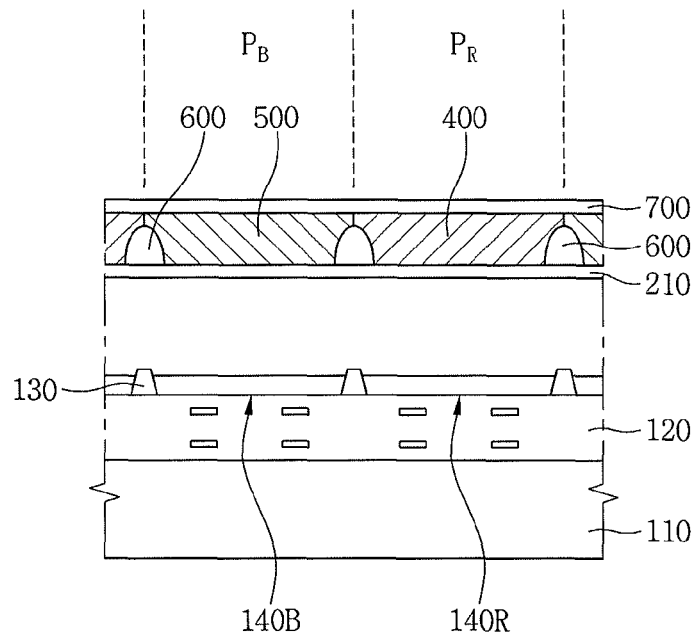
Figure 18A:
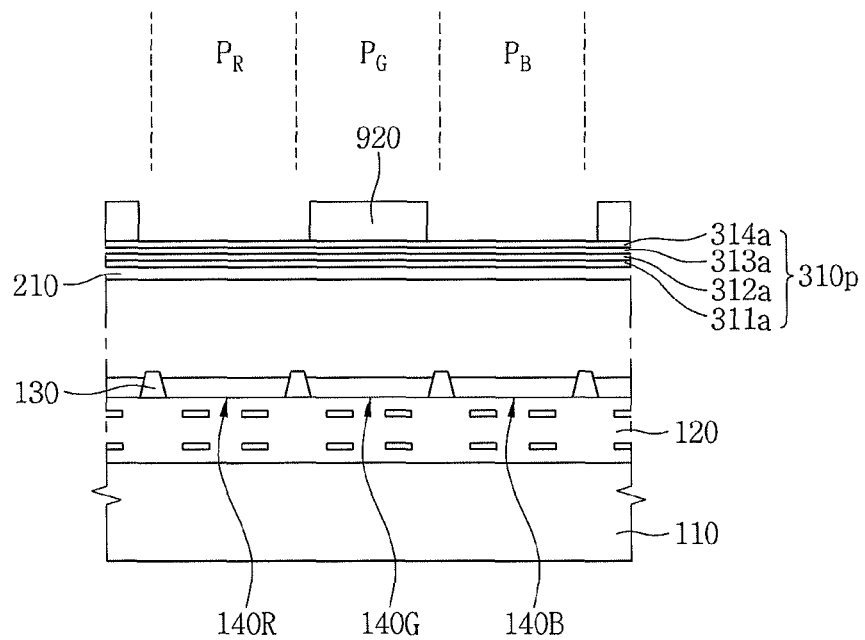
Figure 18B:
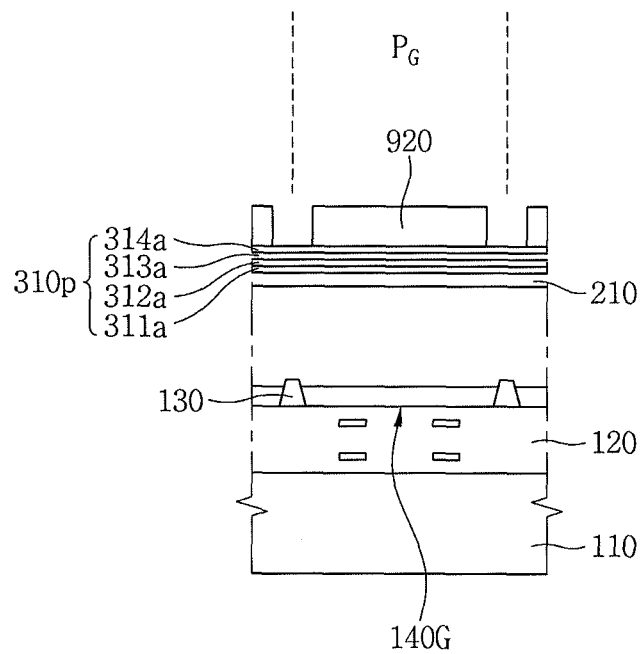
Figure 18C:
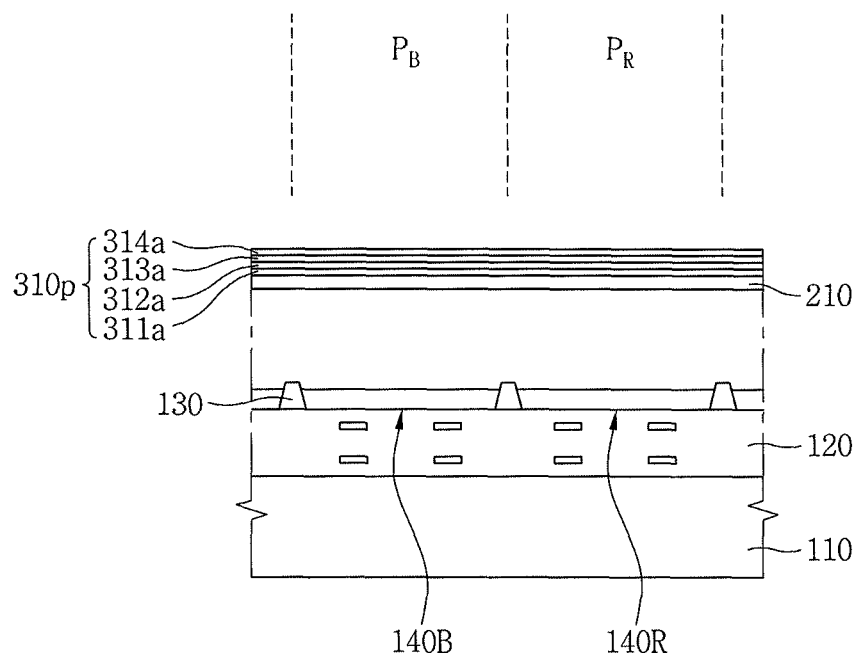

Referring to FIGS. 17A to 17C, the method of manufacturing the image sensor may include forming the planarization layer 700 on the green color filters 300, the blue color filters 400, the red color filters 500, and the metal pattern 600.

Forming the planarization layer 700 may include coating an insulating material to cover the green color filters 300, the blue color filters 400, the red color filters 500, and the metal pattern 600.

Referring to FIGS. 3A to 3E, the method of manufacturing the image sensor may include forming microlenses 800 on the planarization layer 700.

FIGS. 18A to 23A, 18B to 23B, and 18C to 23C illustrate cross-sectional views of stages in a method of manufacturing an image sensor in accordance with embodiments. FIG. 23D illustrates an enlarged cross-sectional view of a portion 'F' shown in FIG. 23A.

The method of manufacturing the image sensor will be described with reference to FIGS. 1, 5A to 5D, 18A to 23A, 18B to 23B, 18C to 23C, and 23D. Firstly, referring to FIGS. 1, 18A to 18C, the method of manufacturing the image sensor may include preparing the support substrate 110 including the plurality of green pixels PG, the plurality of blue pixels PB, and the plurality of red pixels PR, forming a preliminary lower green inorganic color filter layer 310*a* on the support substrate 110, and forming a first green mask pattern 920 on the preliminary lower green inorganic color filter layer 310*a*.

The green pixels PG may have a zigzag shape. The blue pixels PB and the red pixels PR may be between the green pixels PG. The insulating interlayer 120, the plurality of isolation structures 130, the plurality of green photoelectric elements 140G, the plurality of blue photoelectric elements 140B, the plurality of red photoelectric elements 140R, and the buffer layer 210 may be between the support substrate 110 and the preliminary lower green color filter layers 310*a*.

The forming of the preliminary lower green inorganic color filter layer 310*a* includes forming a first preliminary lower green inorganic color filter layer 311*a*, a second preliminary lower green inorganic color filter layer 312*a*, a third preliminary lower green inorganic color filter layer 313*a*, and a fourth preliminary lower green inorganic color filter layer 314*a* on the support substrate 110.

A first green mask pattern 920 may be formed on the green pixels PG of the support substrate 110. The first green mask pattern 920 may partially cover the green pixels PG.

Figure 19A:
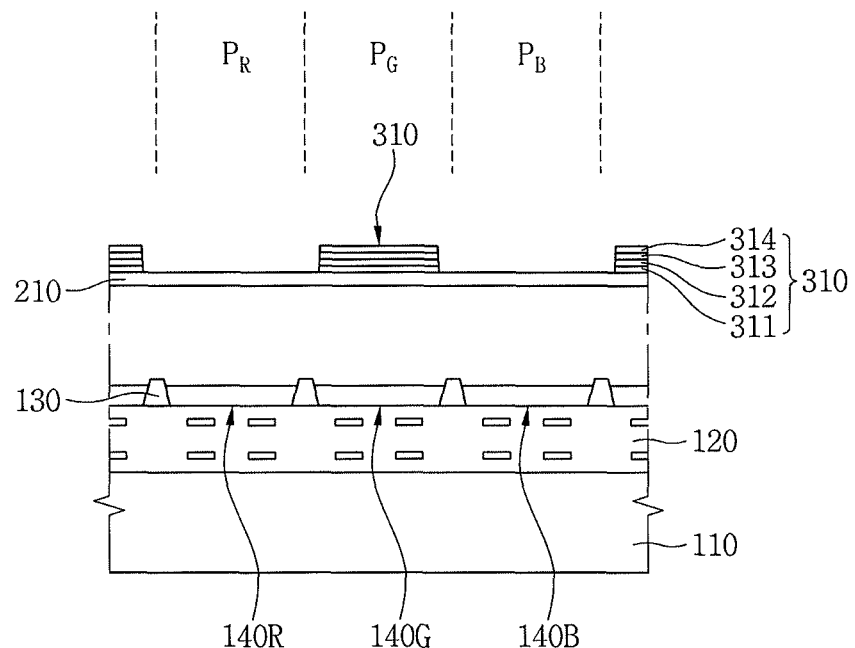
Figure 19B:
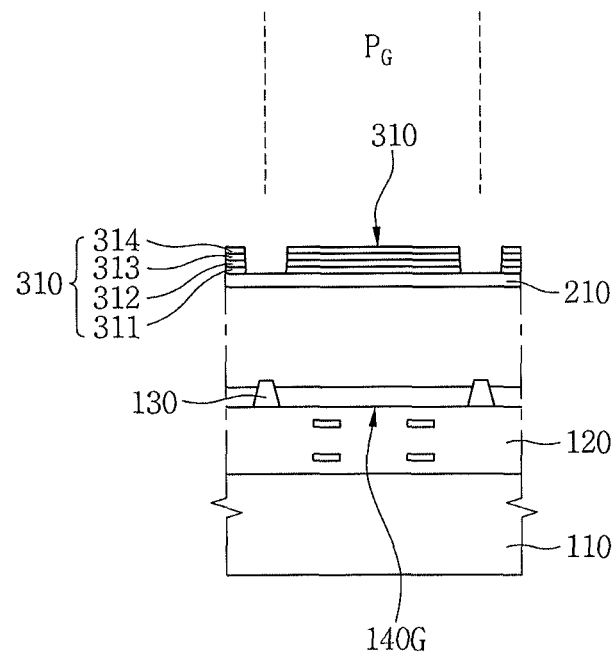
Figure 19C:
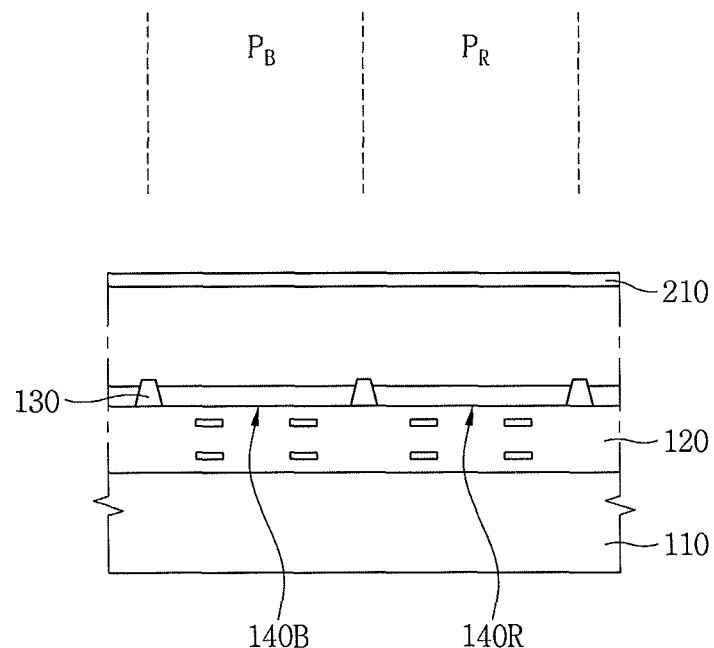

Referring to FIGS. 19A to 19C, the method of manufacturing the image sensor further includes forming the plurality of lower green inorganic color filters 310 on the green pixels PG.

Forming the lower green inorganic color filters 310 may include etching the preliminary lower green inorganic color filter layer 310*a* using the first green mask pattern 920. Etching the preliminary lower green inorganic color filter layer 310*a* may include etching the first preliminary lower green inorganic color filter layer 311*a* to form a first lower green inorganic color filter layer 311, etching the second preliminary lower green inorganic color filter layer 312*a* to form a second lower green inorganic color filter layer 312, etching the third preliminary lower green inorganic color filter layer 313*a* to form a third lower green inorganic color filter layer 313, and etching the fourth preliminary lower green inorganic color filter layer 314*a* to form a fourth lower green inorganic color filter layer 314.

The forming of the lower green inorganic color filters 310 may further include removing the first green mask pattern 920.

Figure 20A:
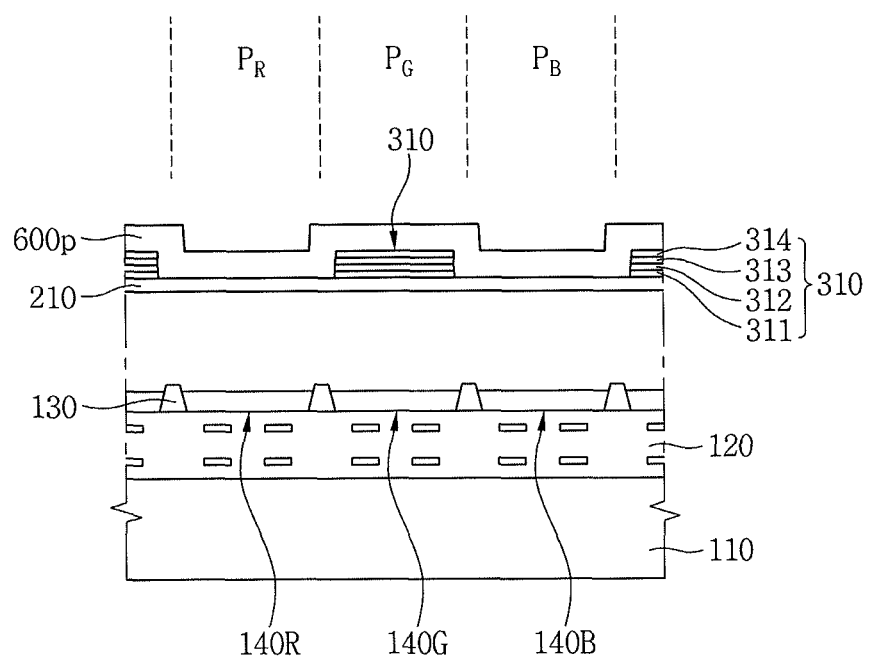
Figure 20B:
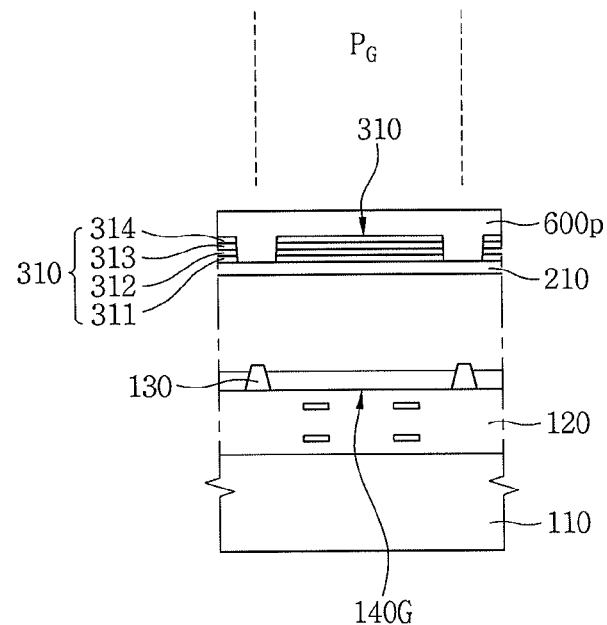
Figure 20C:
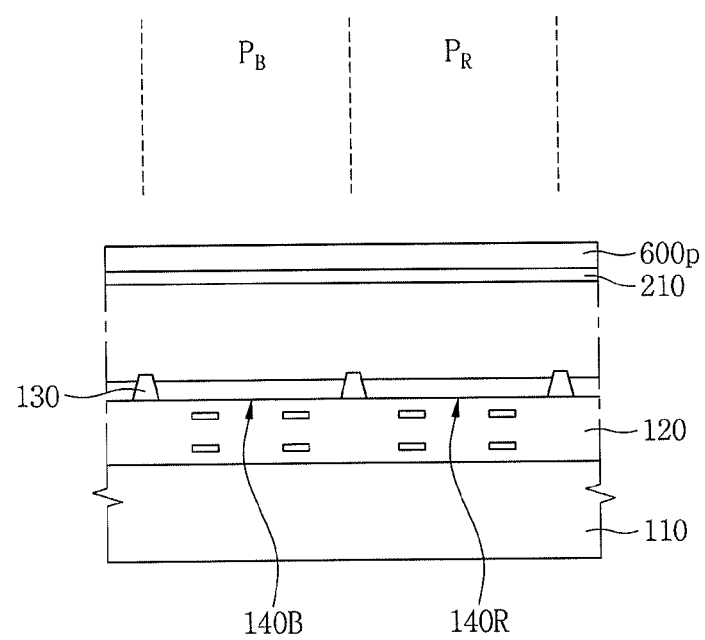

Referring to FIGS. 20A to 20C, the method of manufacturing the image sensor may further include forming a metal layer 600*p* on the lower green inorganic color filters 310.

The forming of the metal layer 600*p* may include entirely filling a space between adjacent lower green inorganic color filters 310 with a metal.

Figure 21A:
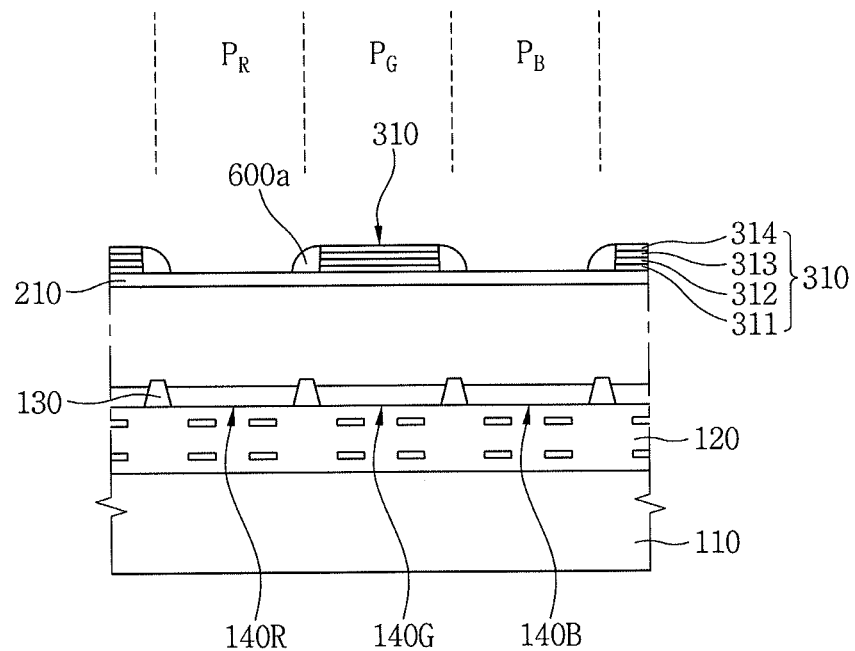
Figure 21B:
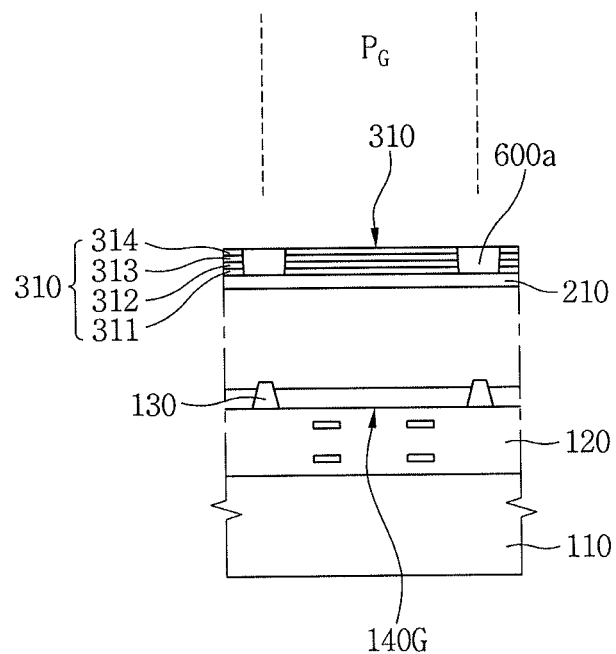
Figure 21C:
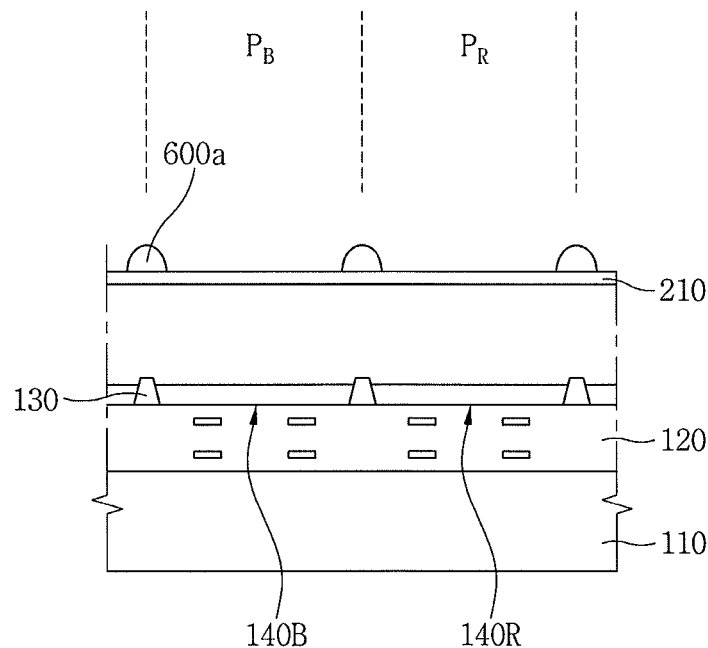

Referring to FIGS. 21A to 21C, the method of manufacturing the image sensor may further include forming the metal pattern 600 on side surfaces of the lower green inorganic color filters 310.

Forming the metal pattern 600 may include blanket etching the metal layer 600*a*. The metal pattern 600 may be formed to have a spacer shape on the side surfaces of the lower green inorganic color filters 310.

Figure 22A:
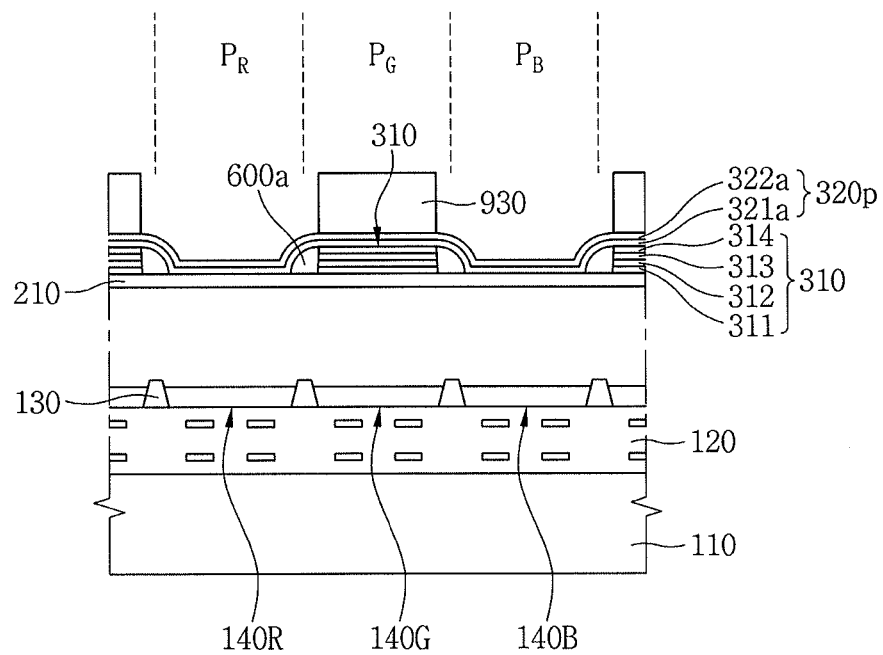
Figure 22B:
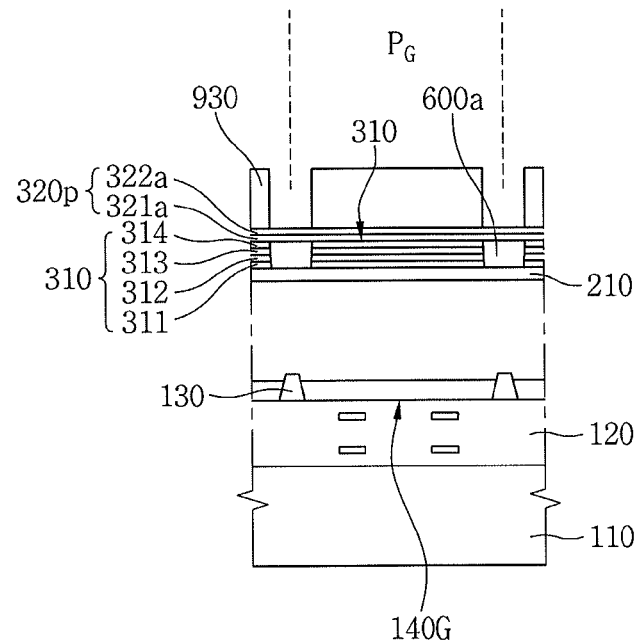
Figure 22C:
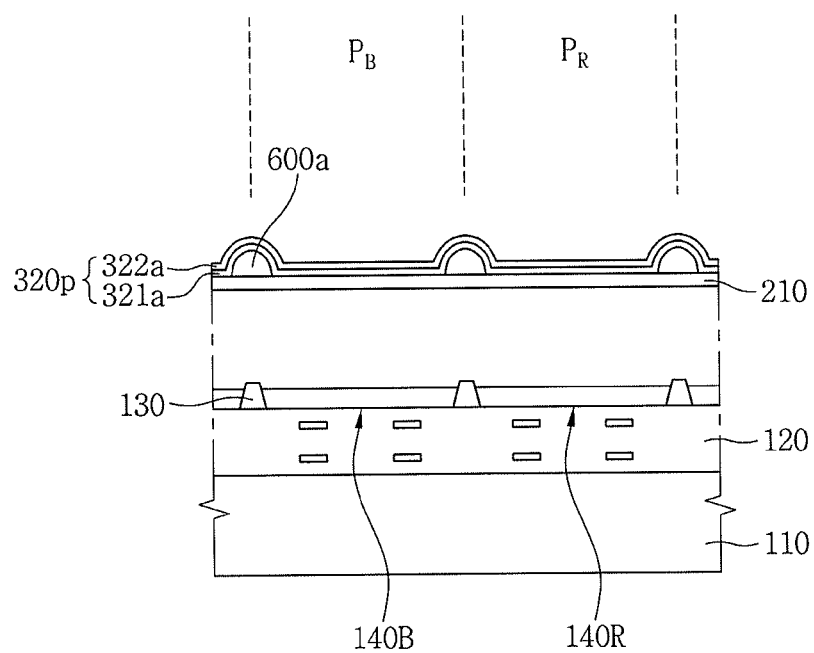
Figure 23A:
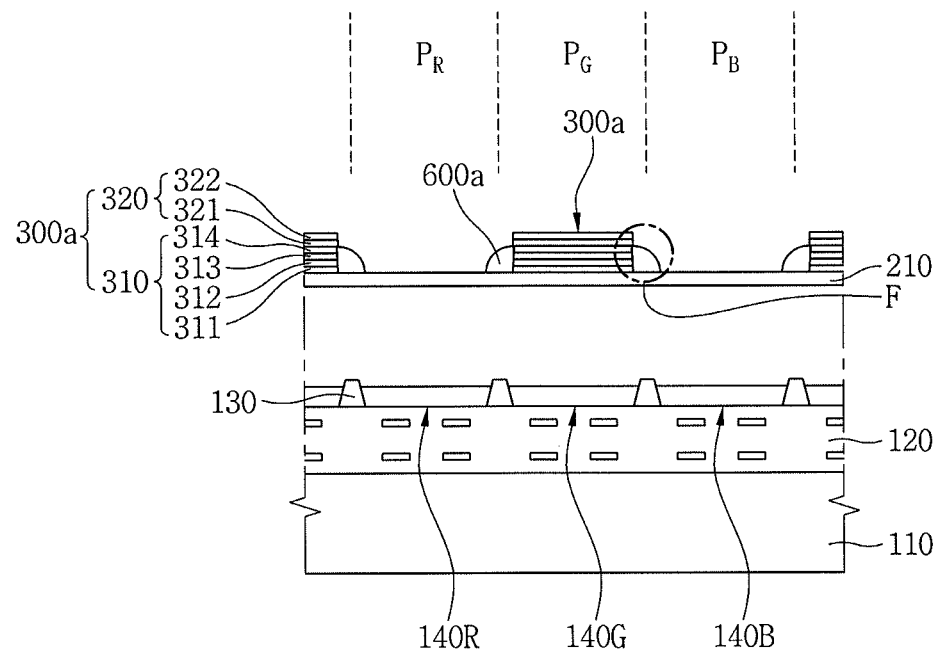
Figure 23B:
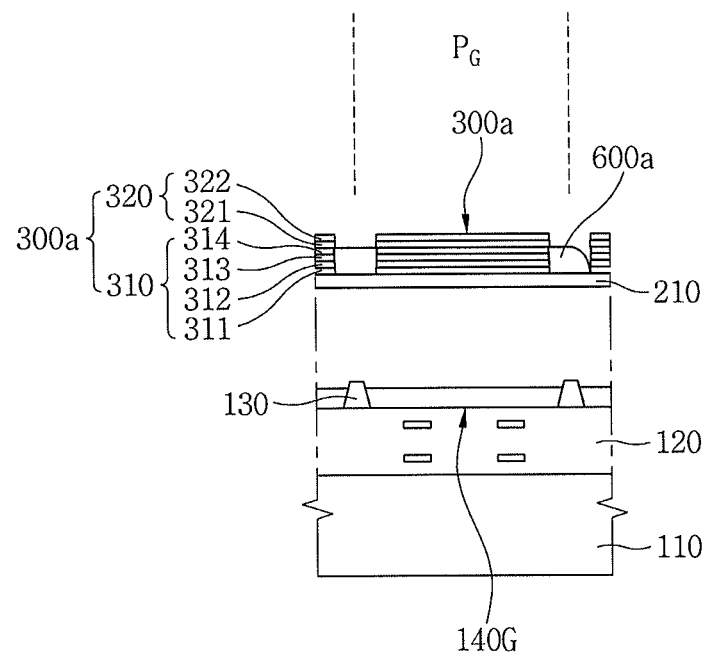
Figure 23C:
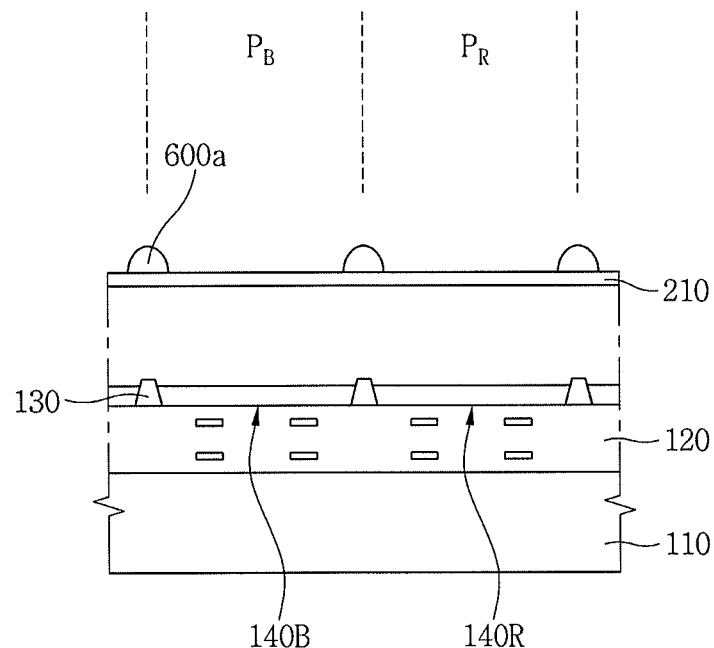
Figure 23D:
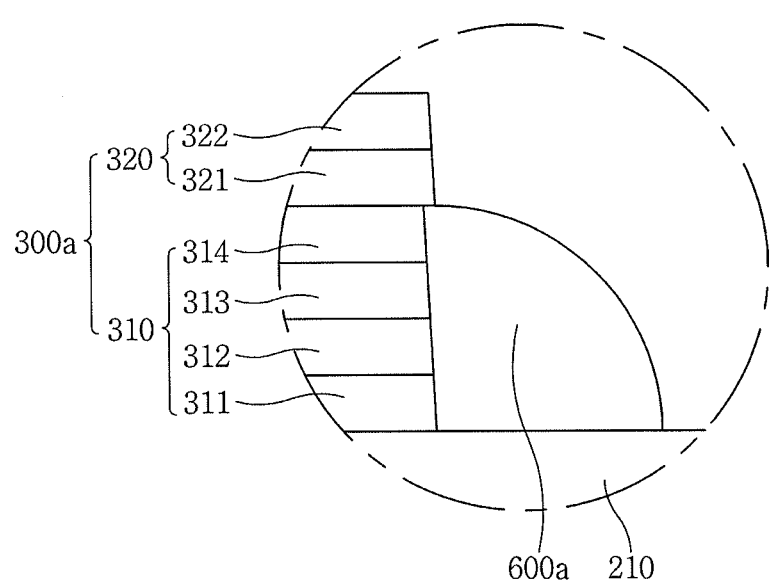
FIG. 23D illustrates an enlarged cross-sectional view of a portion 'F' shown in FIG. 23A.

Referring to FIGS. 22A to 22C, the method of manufacturing the image sensor may further include forming a preliminary upper green inorganic color filter layer 320*p* on the lower green inorganic color filters 310 and the metal pattern 600, and forming a second green mask pattern 930 on the preliminary upper green inorganic color filter layer 320*p*.

Forming of the preliminary upper green inorganic color filter layer 320*p* may include forming a first preliminary upper green inorganic color filter layer 321*a* on the lower green inorganic color filters 310 and the metal pattern 600, and forming a second preliminary upper green inorganic color filter layer 322*a* on the first preliminary upper green inorganic color filter layer 321*a*.

The second green mask pattern 930 may be formed on the green pixels PG. The second green mask pattern 930 may partially cover the green pixels PG. For example, the second green mask pattern 930 may have substantially the same area as the first green mask pattern 920.

Referring to FIGS. 23A to 23D, the method of manufacturing the image sensor may further include forming the green color filters 300 between the metal pattern 600.

The forming of the green color filters 300 may include forming a plurality of upper green inorganic color filters 320 on the lower green inorganic color filters 310. The forming of the upper green inorganic color filters 320 may include etching the preliminary upper green inorganic color filter layer 320*p* using the second green mask pattern 930. The etching of the preliminary upper green inorganic color filter layer 320*p* may include etching the first preliminary upper green inorganic color filter layer 321*a* to form the first upper green inorganic color filter layer 321, and etching the second preliminary upper green inorganic color filter layer 322*a* to form a second upper green inorganic color filter layer 322.

A lower surface of the first upper green inorganic color filter layer 321 may have a greater area than an upper surface of the fourth lower green inorganic color filter layer 314. An upper portion of the metal pattern 600 may be covered by the upper green color inorganic filters 320. The upper green inorganic color filters 320 may extend onto the metal pattern 600.

Forming of the green color filters 300 may further include removing the second green mask pattern 930.

Referring to FIGS. 5A to 5D, the method of manufacturing the image sensor may further include forming the blue color filters 400 between the metal pattern 600*a*, forming the red color filters 500 between the metal pattern 600*a*, forming the planarization layer 700 on the green color filters 300*a*, the blue color filters 400, the red color filters 500 and the metal pattern 600*a*, and forming the microlenses 800 on the planarization layer 700.

Figure 24:
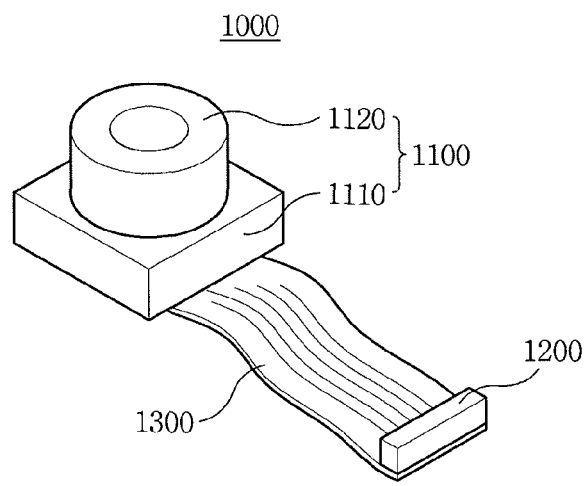
FIG. 24 illustrates a schematic view showing a camera module including an image sensor in accordance with embodiments.

FIG. 24 illustrates a perspective view of a camera module including an image sensor in accordance with embodiments.

Referring to FIG. 24, the camera module 1000 includes a body 1100, a plurality of external terminals 1200, and a printed circuit board 1300. The body 1100 may include an image processor 1110 and a lens part 1120. The image processor 1110 may include various image sensors in accordance with various exemplary embodiments. Thus, the reliability of the camera module 1000 may be improved.

Figure 25:
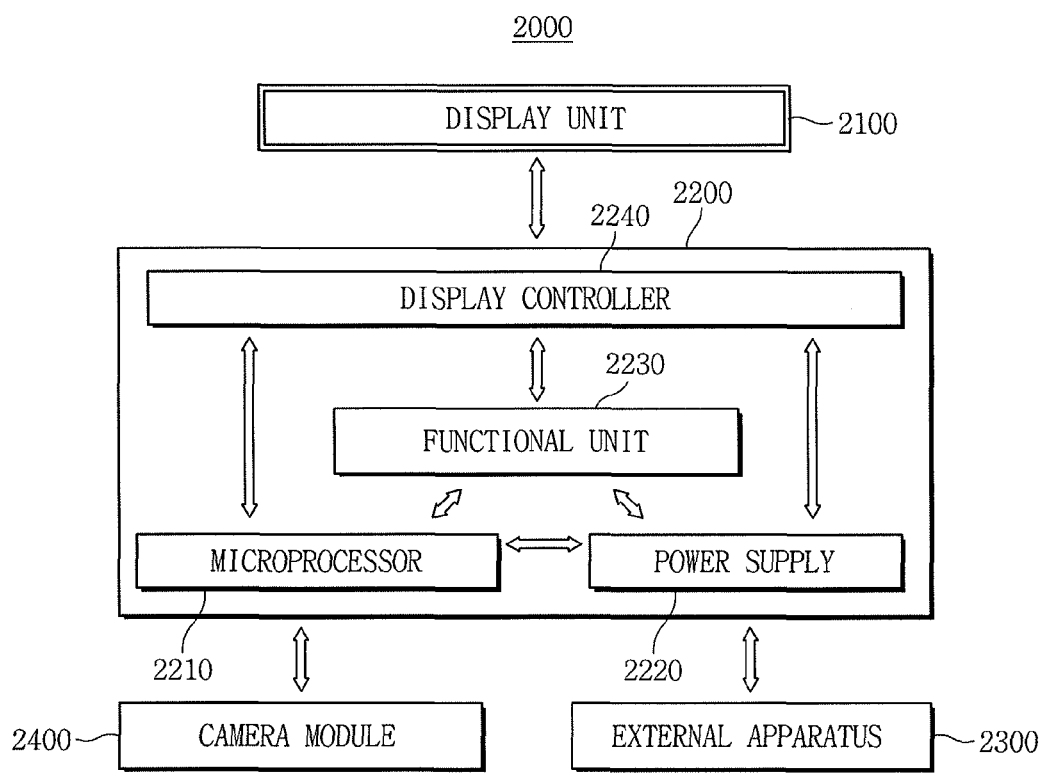
FIG. 25 illustrates a schematic view showing a mobile system including an image sensor in accordance with embodiments.

FIG. 25 illustrates a block diagram of a mobile system including an image sensor in accordance with embodiments.

Referring to FIG. 25, the mobile system 2000 may include a display unit 2100, a body unit 2200, an external apparatus 2300, and a camera module 2400. The body unit 2200 may include a microprocessor 2210, a power supply 2220, a functional unit 2230, and a display controller 2240.

The display unit 2100 may be electrically connected to the body unit 2200. The display unit 2100 may be electrically connected to the display controller 2240 of the body unit 2200. The display unit 2100 may display an image processed by the display controller 2240 of the body unit 2200.

The body unit 2200 may include a system board or a mother board having a printed circuit board (PCB). The microprocessor 2210, the power supply 2220, the functional unit 2230, and the display controller 2240 may be installed or mounted on the body unit 2200.

The microprocessor 2210 receives a voltage from the power supply 2220 to control the functional unit 2230 and the display controller 2240. The power supply 2220 receives a predetermined voltage from an outside power supply to divide the outside voltage into a plurality of voltages having various levels, and supplies the divided voltages to the microprocessor 2210, the functional unit 2230, and the display controller 2240.

The power supply 2220 may include a power management IC (PMIC). The PMIC may effectively supply the voltages to the microprocessor 2210, the functional unit 2230, and the display controller 2240.

The functional unit 2230 may perform various functions of the mobile system 2000. For example, the functional unit 2230 may include various elements configured to perform wireless communication such as image outputting, sound outputting through a speaker, etc. For example, the functional unit 2230 may perform substantially the same function as an image processor of the above-mentioned camera module 2400.

When the mobile system 2000 is connected to a memory card, etc., to increase a storage capacity, the functional unit 2230 may function as a memory card controller. When the mobile system 2000 further includes a Universal Serial Bus (USB) to enlarge a function thereof, the functional unit 2230 may function as an interface controller.

The camera module 2400 may include various image sensors in accordance with various exemplary embodiments. Thus, reliability of the mobile system 2000 may be improved.

Figure 26:
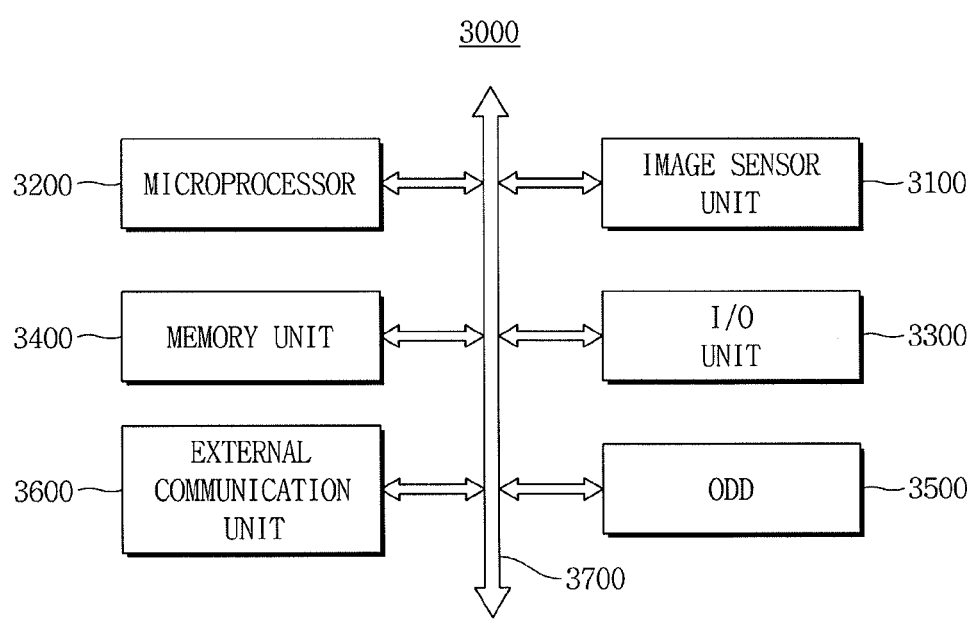
FIG. 26 illustrates a schematic view showing an electronic system including an image sensor in accordance with embodiments.

FIG. 26 illustrates a block diagram of an electronic system including an image sensor in accordance with embodiments.

Referring to FIG. 26, the electronic system 3000 may include an image sensor unit 3100, a microprocessor 3200, an input/output unit (I/O unit) 3300, a memory unit 3400, and a bus 3700.

The image sensor unit 3100 may generate a signal based on an incident light and transmit the signal to the microprocessor 3200. The microprocessor 3200 may program and control the electronic system 3000. The I/O unit 3300 may perform data communication using the bus 3700. The I/O unit 3300 may input data to the electronic system 3000 or output data from the electronic system 3000. The memory unit 3400 may store a plurality of codes for booting the microprocessor 3200, data processed by the microprocessor 3200, or data inputted from an outside. The memory unit 3400 may include a controller and a memory. The image sensor unit 3100, the microprocessor 3200, the I/O unit 3300, and the memory unit 3400 may communicate through the bus 3700.

The electronic system 3000 may further include an optical disk drive (ODD) 3500 and an external communication unit 3600. For example, the ODD 3500 may include a CD-ROM drive, a DVD drive, etc. The external communication unit 3600 may include a modem, a LAN card, or a USB, an external memory, a WiBro communication device, an infrared communication device, etc.

The image sensor unit 3100 may include various image sensors in accordance with various exemplary embodiments. Thus, the reliability of the image sensor unit 3100 of the electronic system 3000 may be improved.

By way of summation and review, according to embodiments, by forming the inorganic color filter before forming the metal pattern and forming the organic color filter layer after the metal pattern, damage to the color filters may be reduced or prevented. Further, as a metal layer is formed on the inorganic color filter, a sidewall thereof may be conformal to at least a portion of an adjacent sidewall of the inorganic color filter. Similarly, as at least one organic color filter layer is formed on the metal pattern, a sidewall thereof may be conformal to at least a portion of an adjacent sidewall of the metal pattern.

Embodiments provide an image sensor and a method of manufacturing the image sensor, which can form a metal pattern between color filters without damage thereto, e.g., degradation of the color filters, etc.

Embodiments also provide an image sensor having an improved ESD effect and a method of manufacturing the image sensor.

According to the image sensor and the method of manufacturing the image sensor, the metal pattern may surround the color filters without damage such as degradation of the color filters, etc. Therefore, reliability of the image sensor and the method of manufacturing the image sensor may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor comprising:
   an inorganic color filter on a support substrate;
   an organic color filter on the support substrate, the organic color filter spaced apart from the inorganic color filter; and
   a metal pattern between the inorganic color filter and the organic color filter, wherein the organic color filter extends onto the metal pattern.

2. The image sensor as claimed in claim 1, wherein a horizontal width of an upper surface of the organic color filter is larger than a horizontal width of an upper surface of the inorganic color filter.

3. The image sensor as claimed in claim 1, wherein a level of an upper surface of the organic color filter is higher than a level of an upper surface of the inorganic color filter.

4. The image sensor as claimed in claim 1, further comprising a microlens on the inorganic color filter, wherein a horizontal width of a lower surface of the microlens is larger than a horizontal width of an upper surface of the inorganic color filter.

5. The image sensor as claimed in claim 1, wherein a level of an upper end of the metal pattern is lower than a level of an upper surface of the inorganic color filter.

6. The image sensor as claimed in claim 2, wherein a horizontal width of a lower surface of the organic color filter is same as a horizontal width of a lower surface of the inorganic color filter.

7. The image sensor as claimed in claim 5, wherein the inorganic color filter comprises a lower inorganic color filter and an upper inorganic color filter on the lower inorganic color filter, and wherein the upper inorganic color filter extends onto the metal pattern.

8. An image sensor comprising:
an inorganic color filter;
a metal pattern surrounding side surfaces of the inorganic color filter;
a first organic color filter spaced apart from the inorganic color filter in a first direction; and
a second organic color filter spaced apart from the inorganic color filter in a second direction that is perpendicular to the first direction, wherein a length of the first organic color filter in the second direction is greater than a length of the inorganic color filter in the second direction, and wherein a length of the second organic color filter in the first direction is greater than a length of the inorganic color filter in the first direction.

9. The image sensor as claimed in claim 8, wherein the length of the first organic color filter in the second direction is same as the length of the second organic color filter in the first direction.

10. The image sensor as claimed in claim 8, wherein the length of the first organic color filter in the second direction is same as a length of the first organic color filter in the first direction, and wherein a length of the second organic color filter in the second direction is same as the length of the second organic color filter in the first direction.

11. The image sensor as claimed in claim 8, wherein a side surface of the first organic color filter, which faces the inorganic color filter, is horizontally aligned with a side surface of the second organic color filter, which extends in the second direction, and wherein a side surface of the second organic color filter, which faces the inorganic color filter, is horizontally aligned with a side surface of the first organic color filter, which extends in the first direction.

12. The image sensor as claimed in claim 8, wherein a distance between the inorganic color filter and the first organic color filter is same as a distance between the inorganic color filter and the second organic color filter.

13. The image sensor as claimed in claim 8, wherein the metal pattern directly contacts the inorganic color filter, the first organic color filter, and the second organic color filter.

14. An image sensor comprising:
a metal pattern having first and second sidewalls spaced apart along a first direction,
an inorganic color filter on the first sidewall of the metal pattern, the first sidewall of the metal pattern being conformal to at least a portion of a sidewall of the inorganic color filter;
an organic color filter on the second sidewall of the metal pattern, and having a sidewall conformal to at least a portion of the second sidewall of the first metal pattern, wherein the organic color filter covers the cross section of the metal pattern adjacent to the organic color filter along the diagonal to the first direction.

15. The image sensor as claimed in claim 14, wherein a cross section of the metal pattern adjacent to the inorganic color filter along a diagonal to the first direction has a different shape than a cross section of the metal pattern adjacent to the organic color filter along a diagonal to the first direction.

16. The image sensor as claimed in claim 15, wherein a thickness of the cross section of the metal pattern adjacent to the inorganic color filter along the diagonal to the first direction is different from a thickness of the cross section of the metal pattern adjacent to the organic color filter along the diagonal to the first direction.

17. The image sensor as claimed in claim 14, wherein an upper surface of the first and second metal patterns is at a same level as an upper surface of at least one of the inorganic color filter and the organic color filter.

* * * * *